United States Patent
Chen et al.

(10) Patent No.: US 11,355,488 B2
(45) Date of Patent: *Jun. 7, 2022

(54) INTEGRATED CIRCUIT LAYOUT METHOD, DEVICE, AND SYSTEM

(71) Applicant: TAIWAN SEMICONDUCTOR MANUFACTURING COMPANY, LTD., Hsinchu (TW)

(72) Inventors: Chien-Ying Chen, Chiayi (TW); Lee-Chung Lu, Taipei (TW); Li-Chun Tien, Tainan (TW); Ta-Pen Guo, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/936,175

(22) Filed: Jul. 22, 2020

(65) Prior Publication Data

US 2020/0350307 A1    Nov. 5, 2020

Related U.S. Application Data

(63) Continuation of application No. 16/204,678, filed on Nov. 29, 2018, now Pat. No. 10,741,540.

(Continued)

(51) Int. Cl.
*H01L 27/092* (2006.01)
*H01L 27/02* (2006.01)
*G06F 30/392* (2020.01)

(52) U.S. Cl.
CPC ........ *H01L 27/0207* (2013.01); *G06F 30/392* (2020.01); *H01L 27/092* (2013.01)

(58) Field of Classification Search
CPC .............. H01L 27/0207; H01L 27/092; G06F 17/5072

(Continued)

(56) References Cited

U.S. PATENT DOCUMENTS 6,237,129 B1    5/2001  Patterson
6,834,003 B2   12/2004  Towler (Continued)

FOREIGN PATENT DOCUMENTS

KR    20160121770    10/2016

OTHER PUBLICATIONS

Office Action dated Jul. 31, 2020 from corresponding application No. KR 10-2019-0076842.

(Continued)

*Primary Examiner* — Vu A Vu
(74) *Attorney, Agent, or Firm* — Hauptman Ham, LLP

(57) ABSTRACT

A method of generating a layout diagram of an IC cell includes defining a boundary recess in a boundary of the cell by extending a first portion of the boundary along a first gate track, extending a second portion of the boundary from the first gate track to a second gate track, the second portion being contiguous with the first portion, and extending a third portion of the boundary from the first gate track to the second gate track, the third portion being contiguous with the first portion. An active region is positioned in the cell by extending the active region across a third gate track, wherein the first gate track is between the second gate track and the third gate track. The layout diagram is stored on a non-transitory computer-readable medium.

20 Claims, 28 Drawing Sheets

Related U.S. Application Data

(60) Provisional application No. 62/691,610, filed on Jun. 29, 2018.

(58) Field of Classification Search
USPC .......................................................... 257/401
See application file for complete search history.

(56) References Cited

U.S. PATENT DOCUMENTS

| | | |
|---|---|---|
| 7,260,442 B2 | 8/2007 | Hwang et al. |
| 9,256,709 B2 | 2/2016 | Yu et al. |
| 10,741,540 B2 * | 8/2020 | Chen .................... H01L 27/092 |
| 2007/0002605 A1 | 1/2007 | Koide |
| 2011/0103137 A1 * | 5/2011 | Beat .................... H01L 27/0207 |
| | | 365/156 |
| 2014/0040838 A1 | 2/2014 | Liu et al. |
| 2015/0243667 A1 | 8/2015 | Liaw |
| 2015/0278429 A1 | 10/2015 | Chang |
| 2016/0063166 A1 * | 3/2016 | Hsieh .................... G06F 30/398 |
| | | 257/774 |
| 2018/0254287 A1 * | 9/2018 | Seo ....................... G06F 30/394 |
| 2019/0311954 A1 | 10/2019 | Kim et al. |

OTHER PUBLICATIONS

Office Action dated Jun. 21, 2021 for corresponding case No. CN 201910454755.1 (pp. 1-8).

* cited by examiner

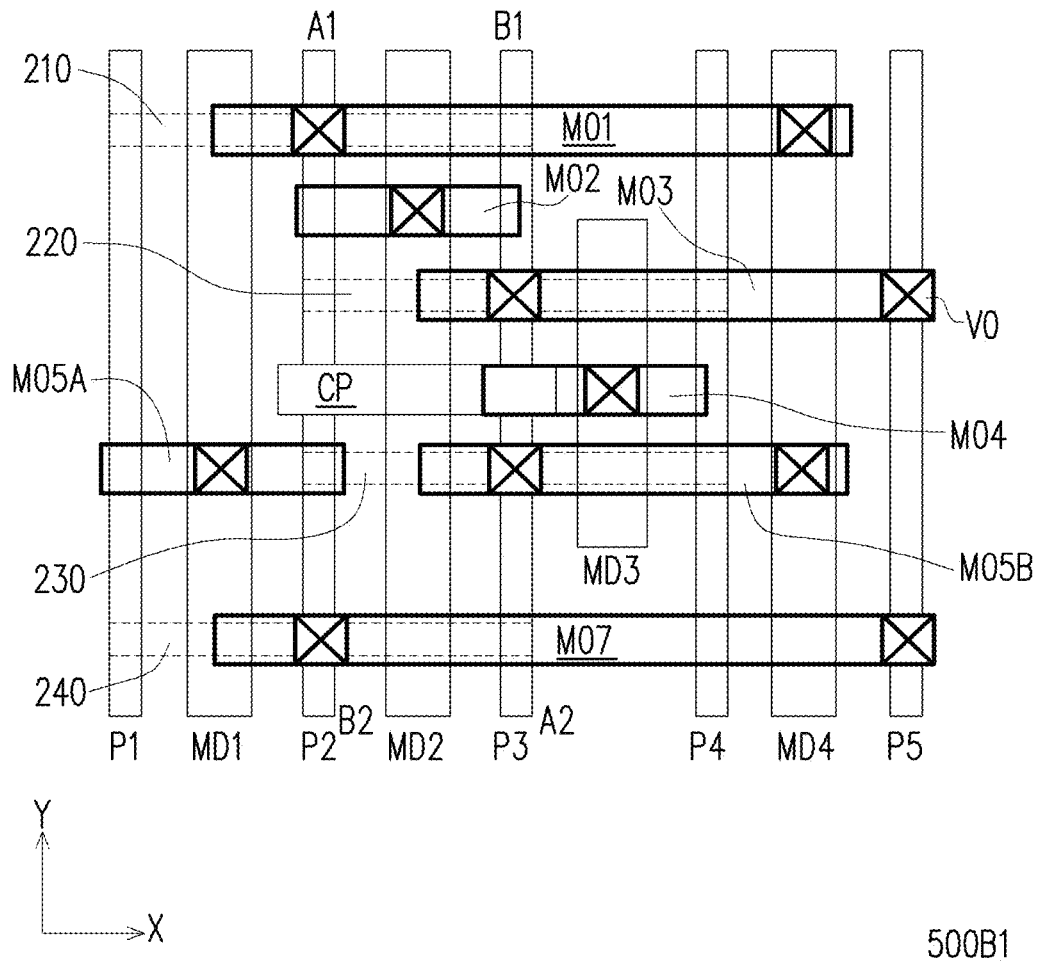
FIG. 5B1

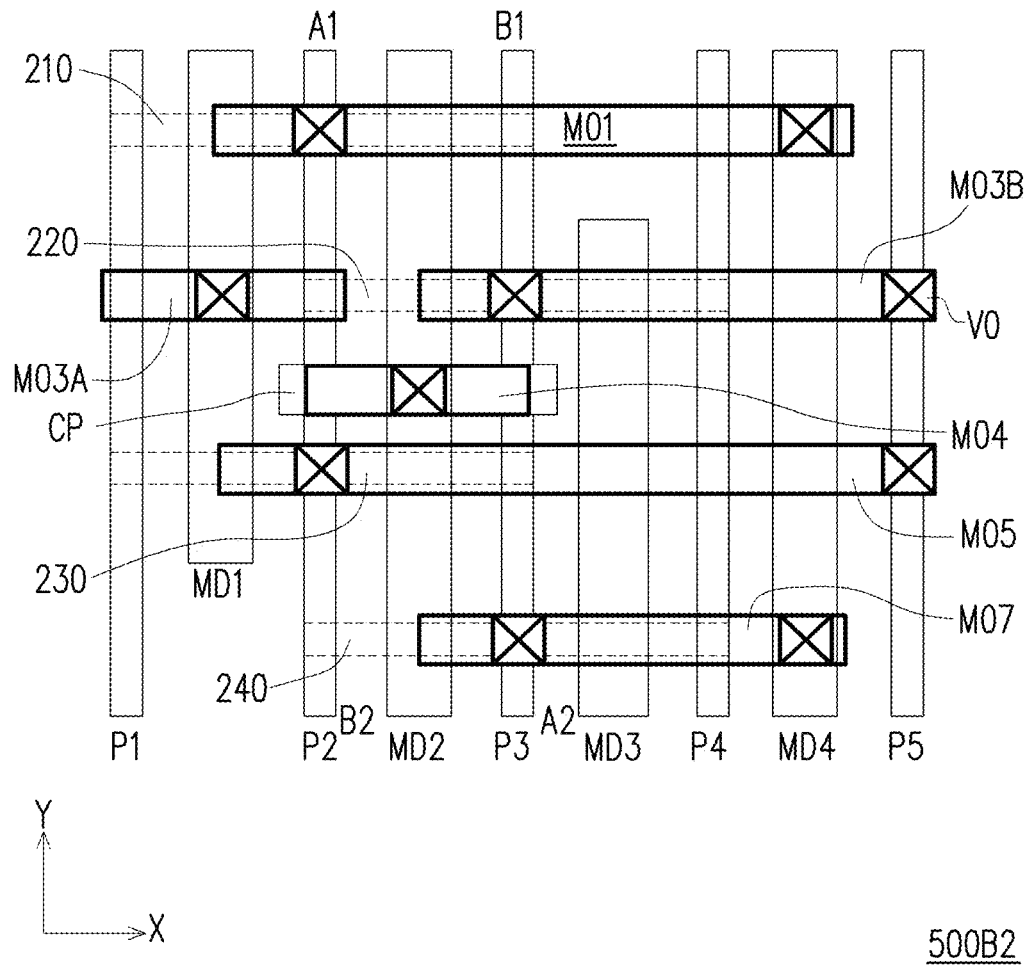
FIG. 5B2

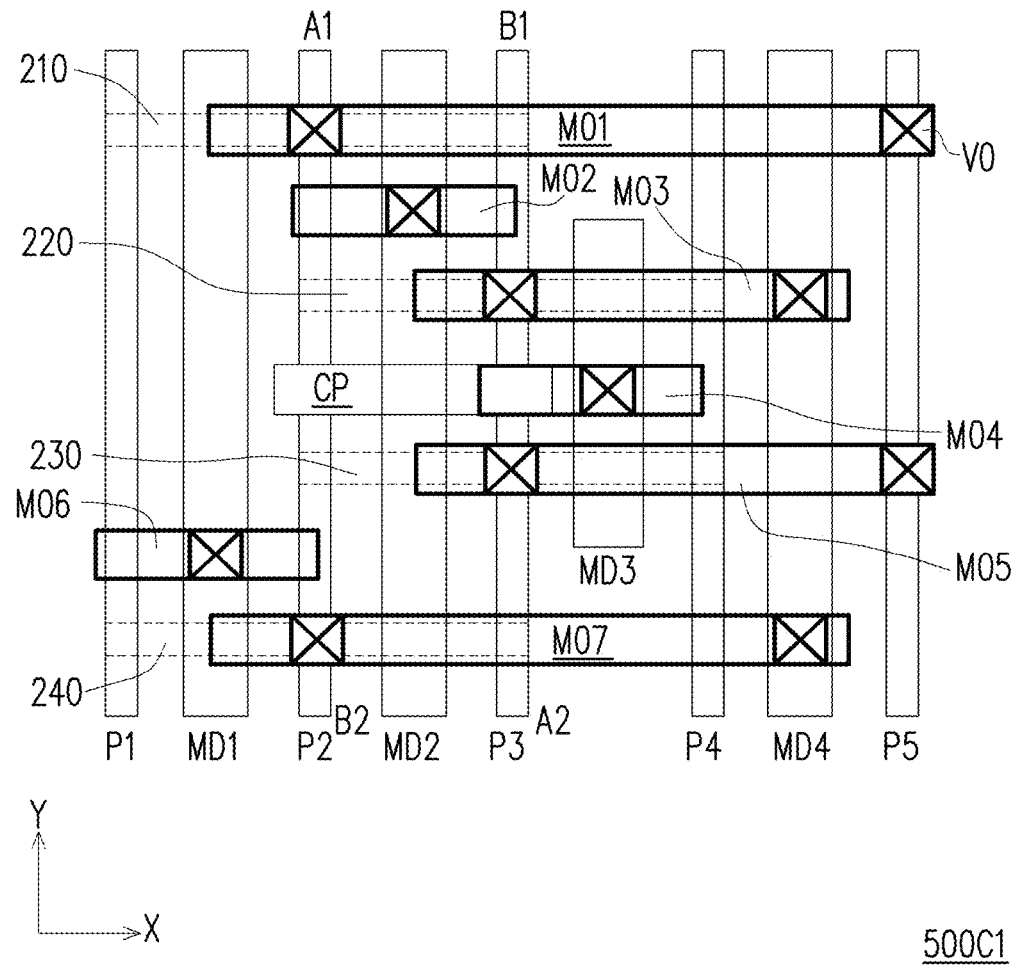
FIG. 5C1

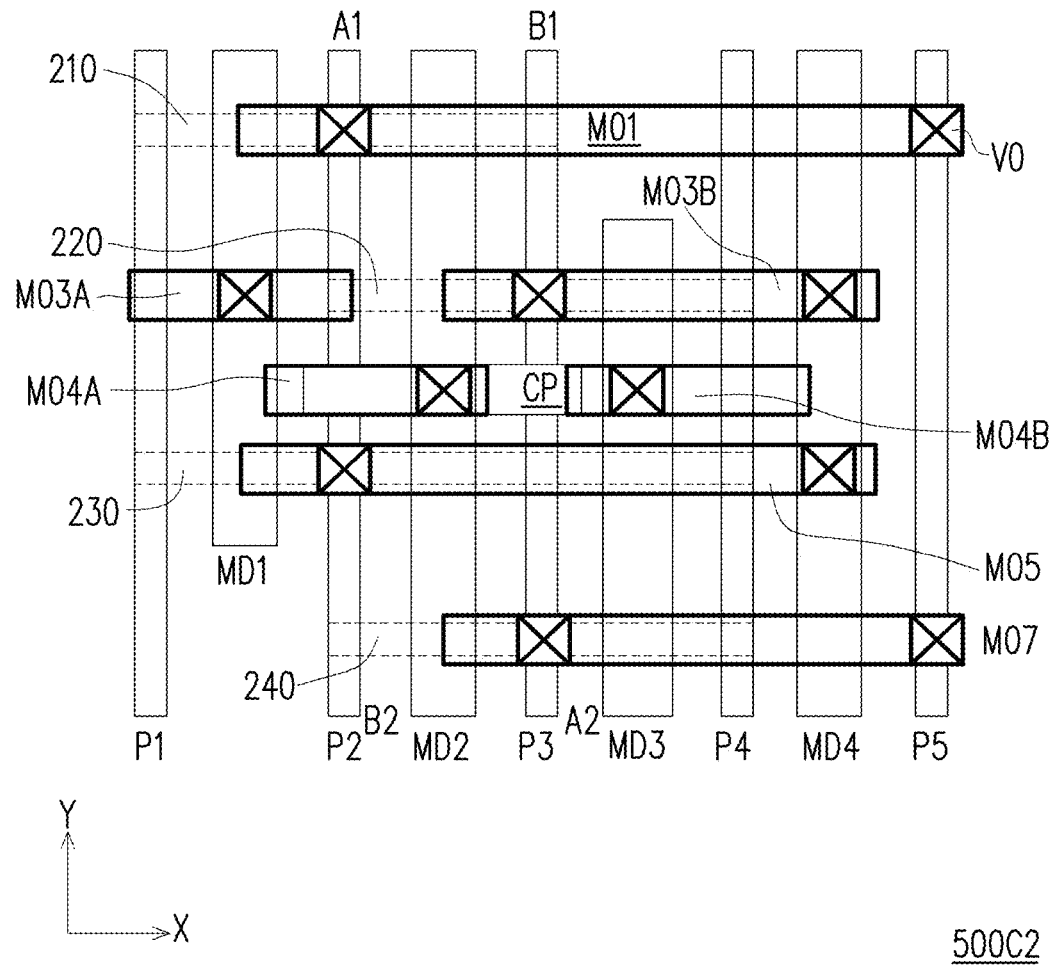
FIG. 5C2

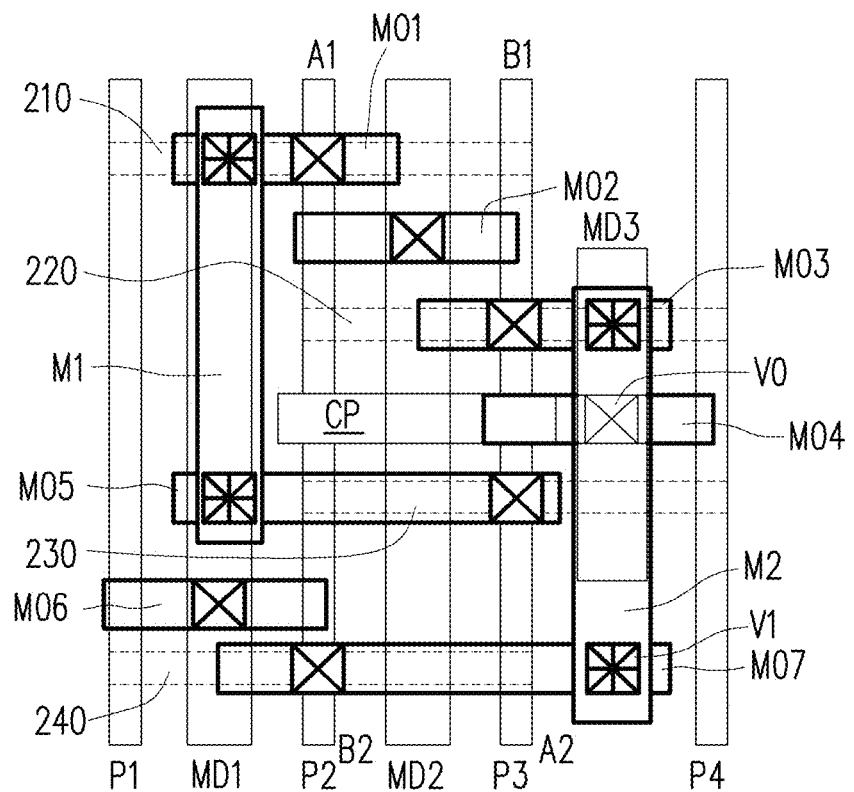
FIG. 5D1

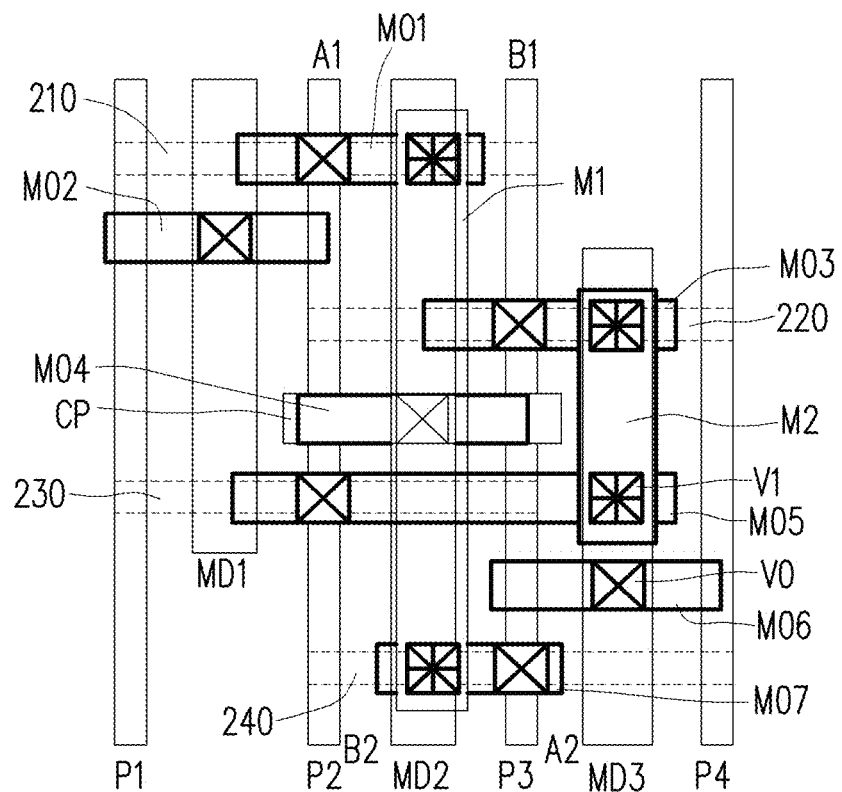
FIG. 5D2

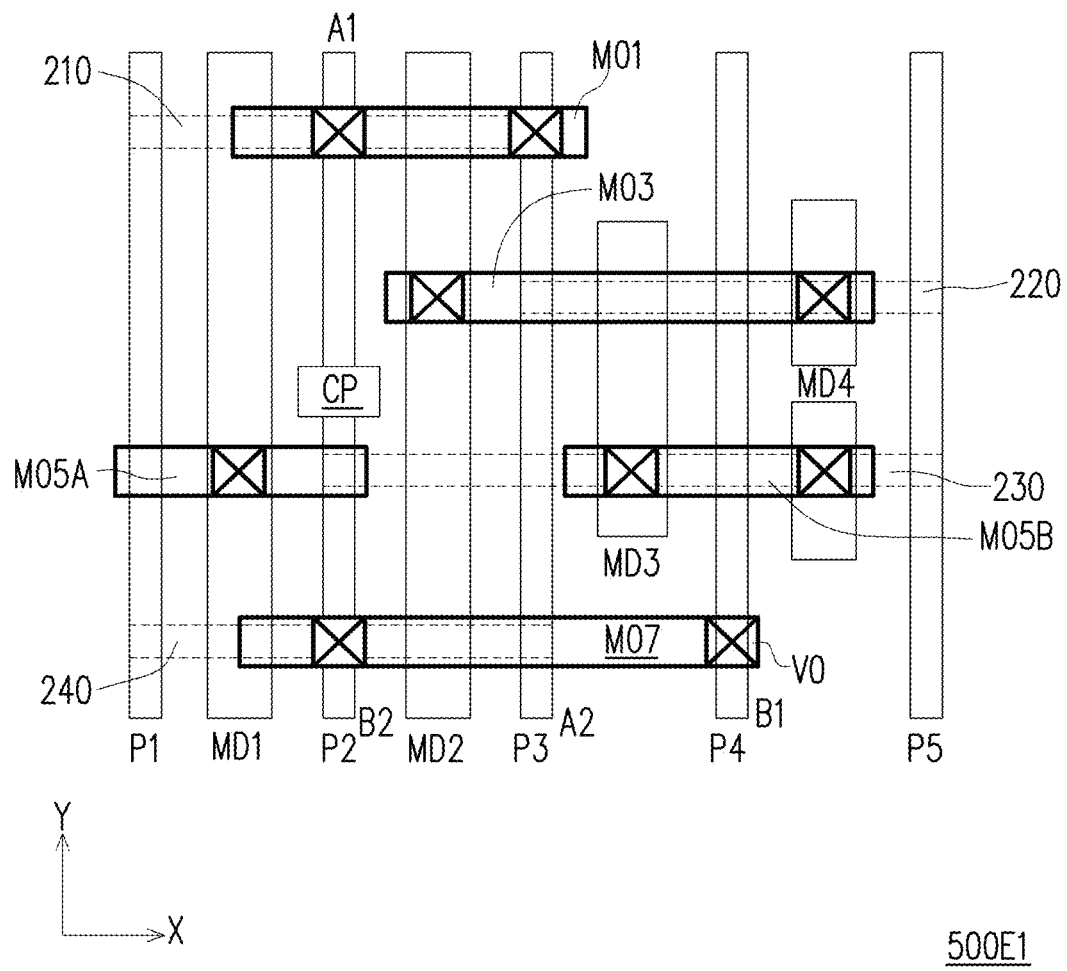
FIG. 5E1

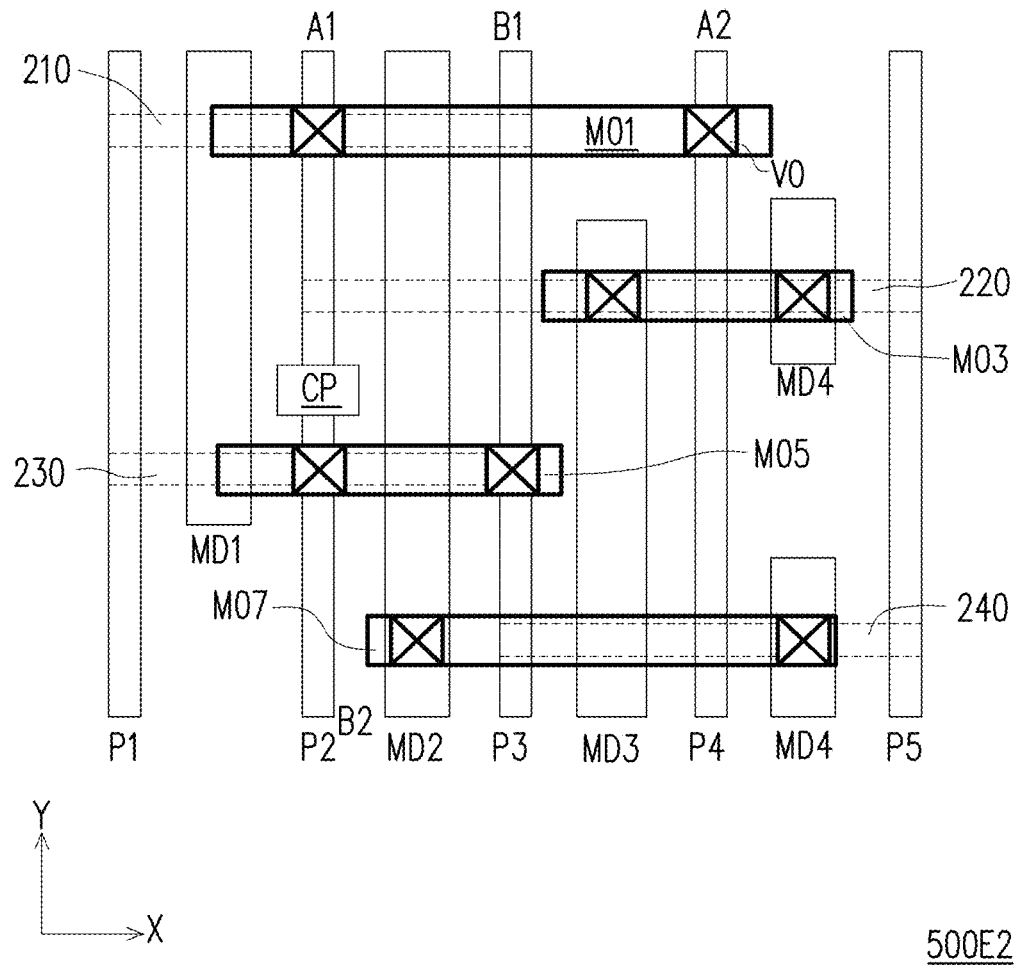
FIG. 5E2

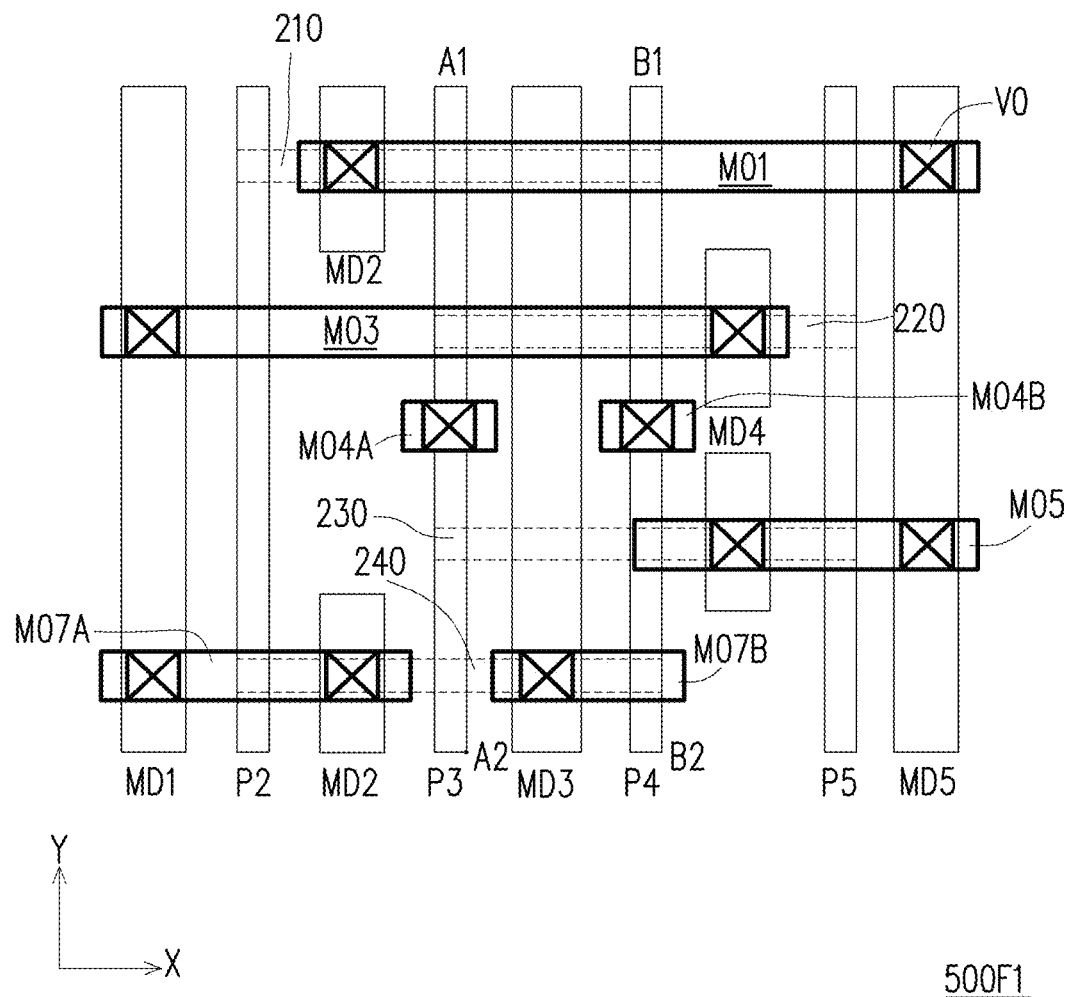
FIG. 5F1

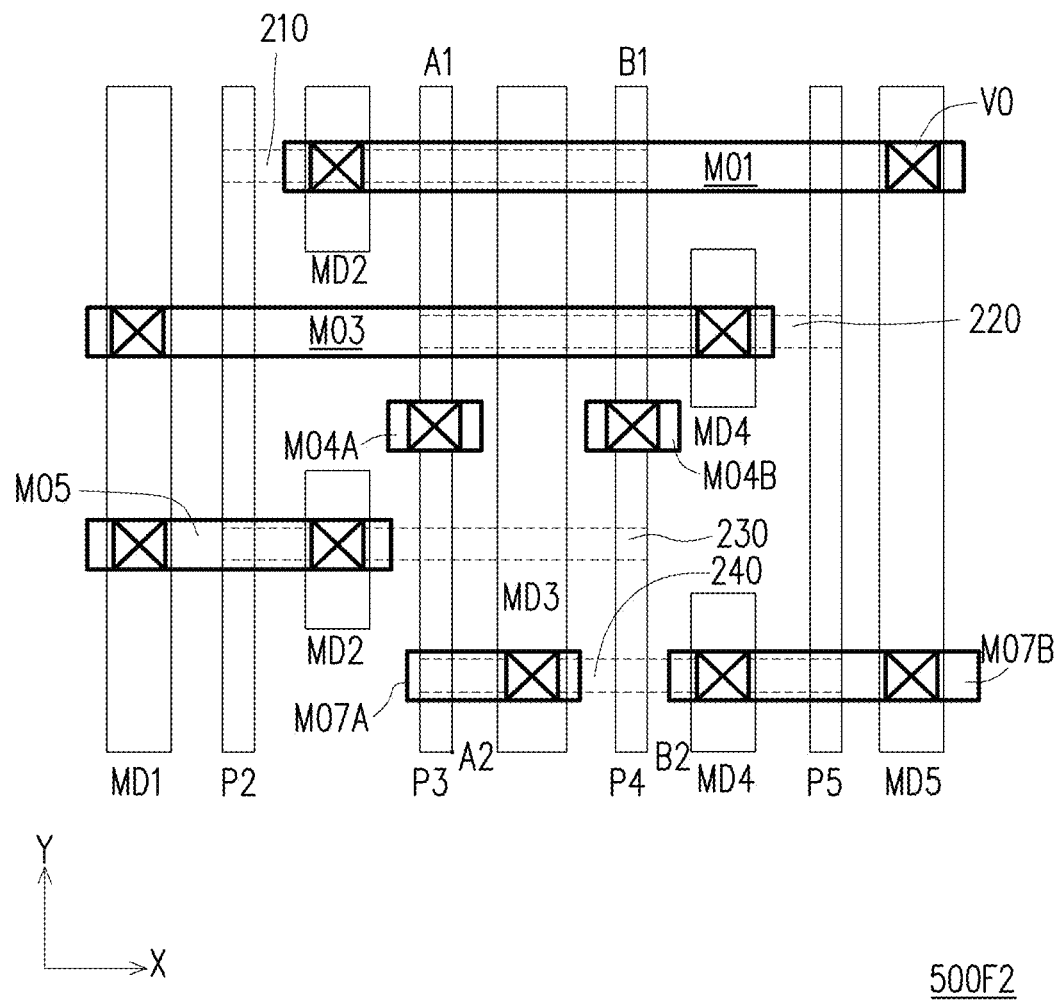
FIG. 5F2

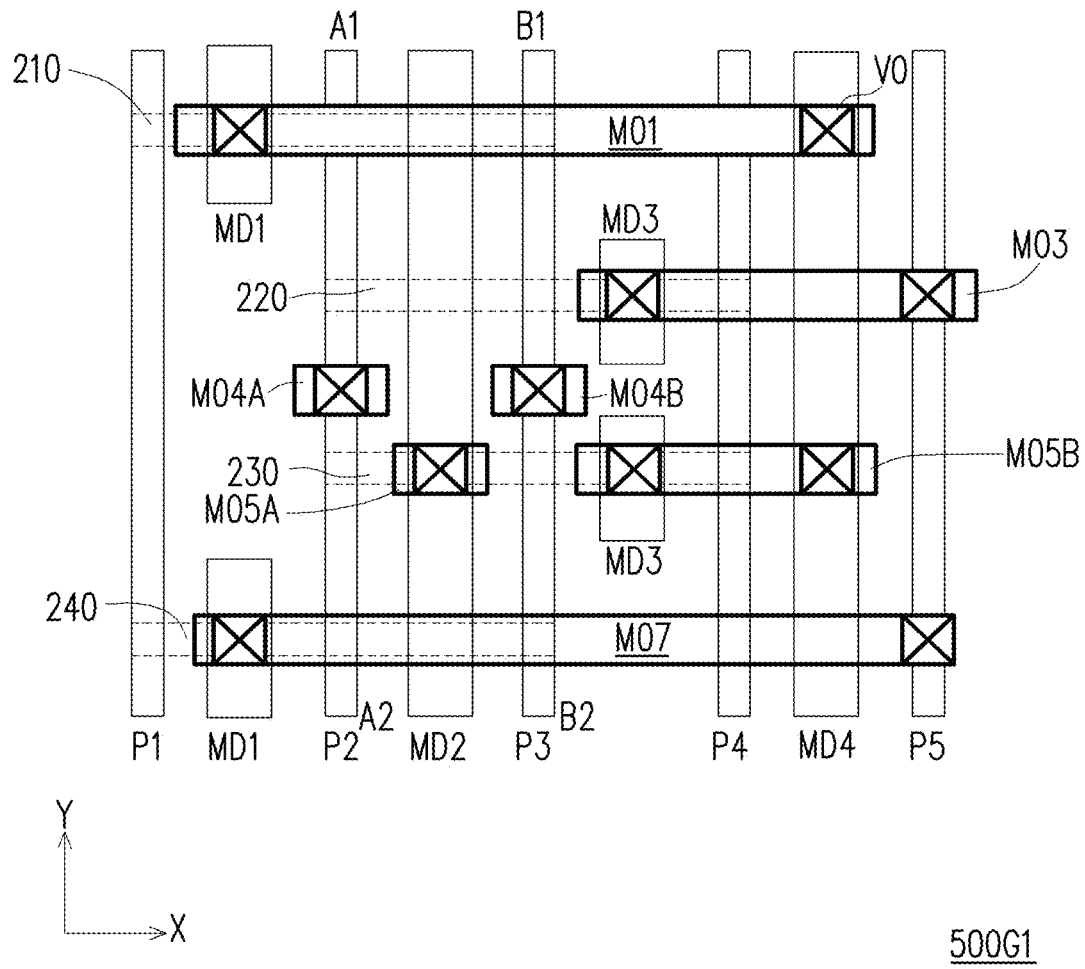
FIG. 5G1

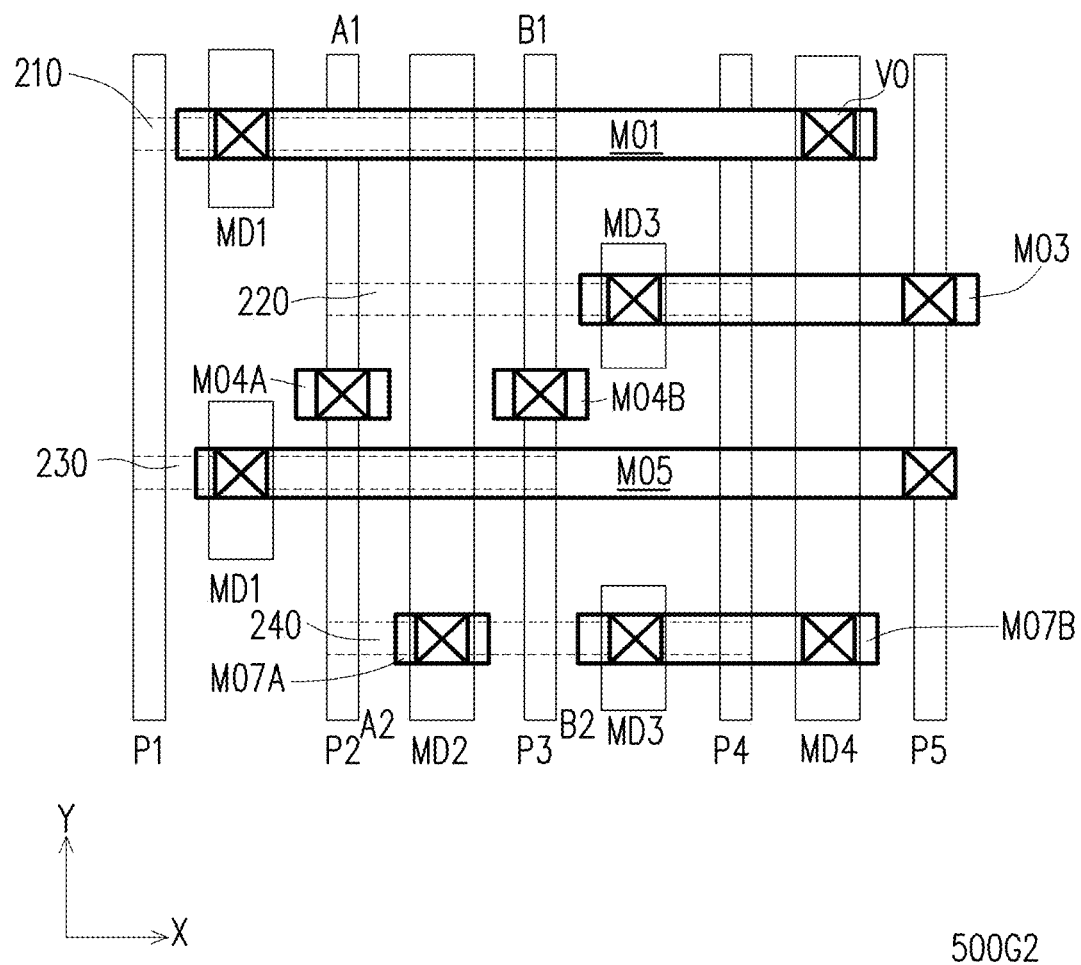
FIG. 5G2

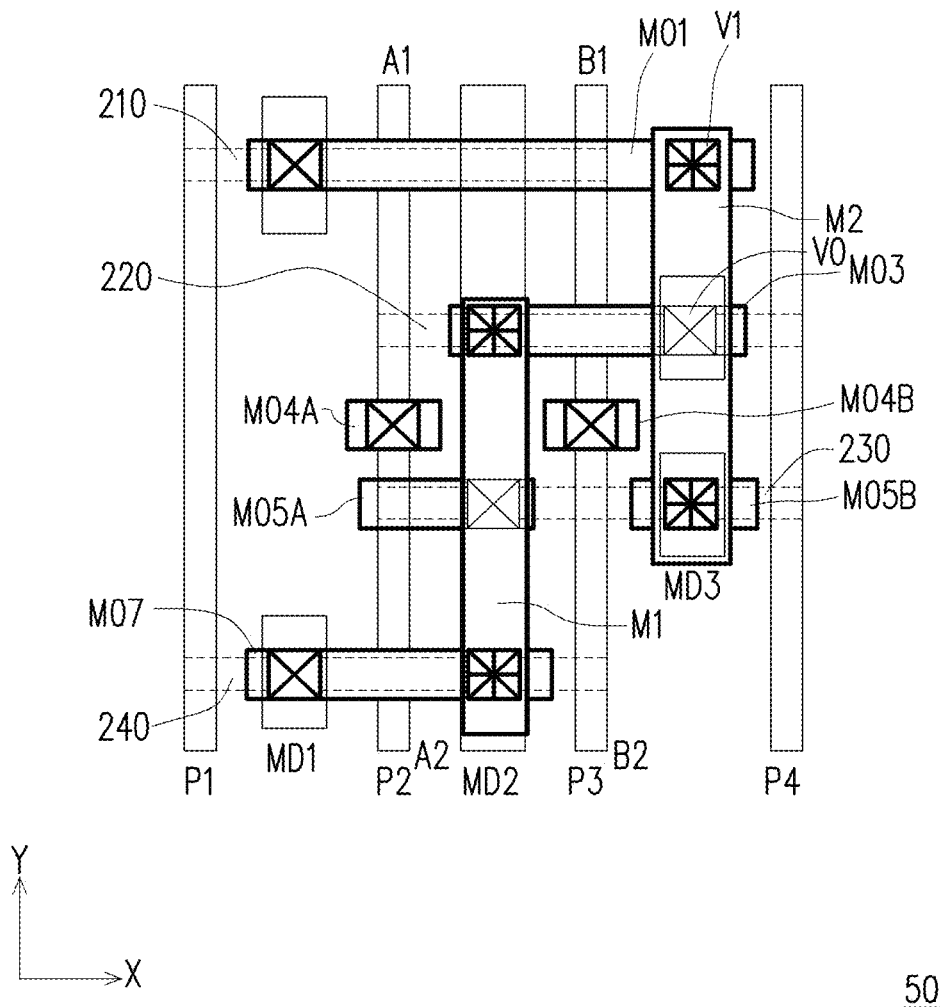
FIG. 5H1

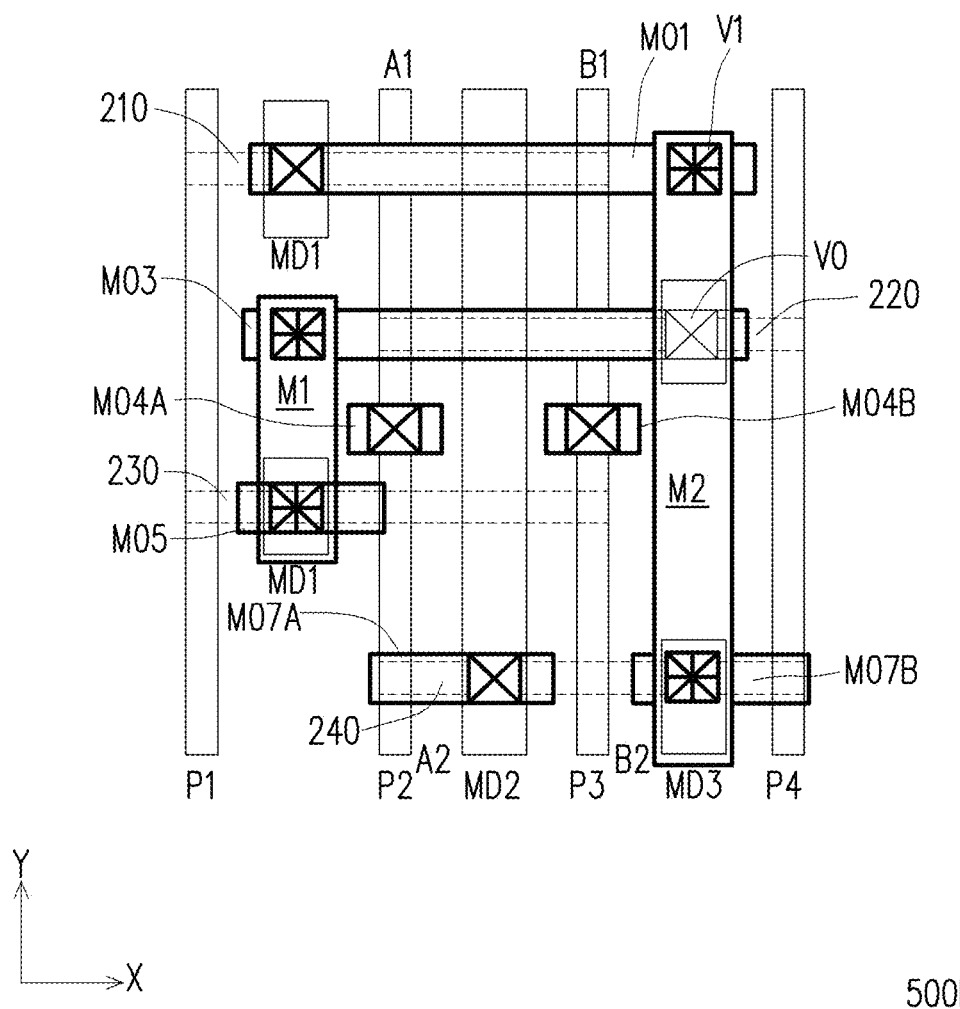
FIG. 5H2

INTEGRATED CIRCUIT LAYOUT METHOD, DEVICE, AND SYSTEM

PRIORITY CLAIM

The present application is a continuation of U.S. application Ser. No. 16/204,678, filed Nov. 29, 2018, which claims the priority of U.S. Provisional Application No. 62/691,610, filed Jun. 29, 2018, each of which is incorporated herein by reference in its entirety.

BACKGROUND

An integrated circuit (IC) typically includes a number of semiconductor devices otherwise known as IC devices. One way to represent an IC device is with a plan view diagram referred to as a layout diagram, or IC layout diagram. An IC layout diagram is hierarchical and includes modules which carry out high-level functions in accordance with the IC device's design specifications. The modules are often built from a combination of cells that can include both standard and custom cells, each of which represents one or more semiconductor structures.

Cells are configured to provide common, low-level functions, often performed by transistors based on gate regions that intersect active regions, sometimes known as oxide definition (OD) regions. The elements of a cell are arranged within a cell boundary and electrically connected to other cells through interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5B1-5H2 are depictions of IC layout diagrams, in accordance with some embodiments.

DETAILED DESCRIPTION

Figure 1:
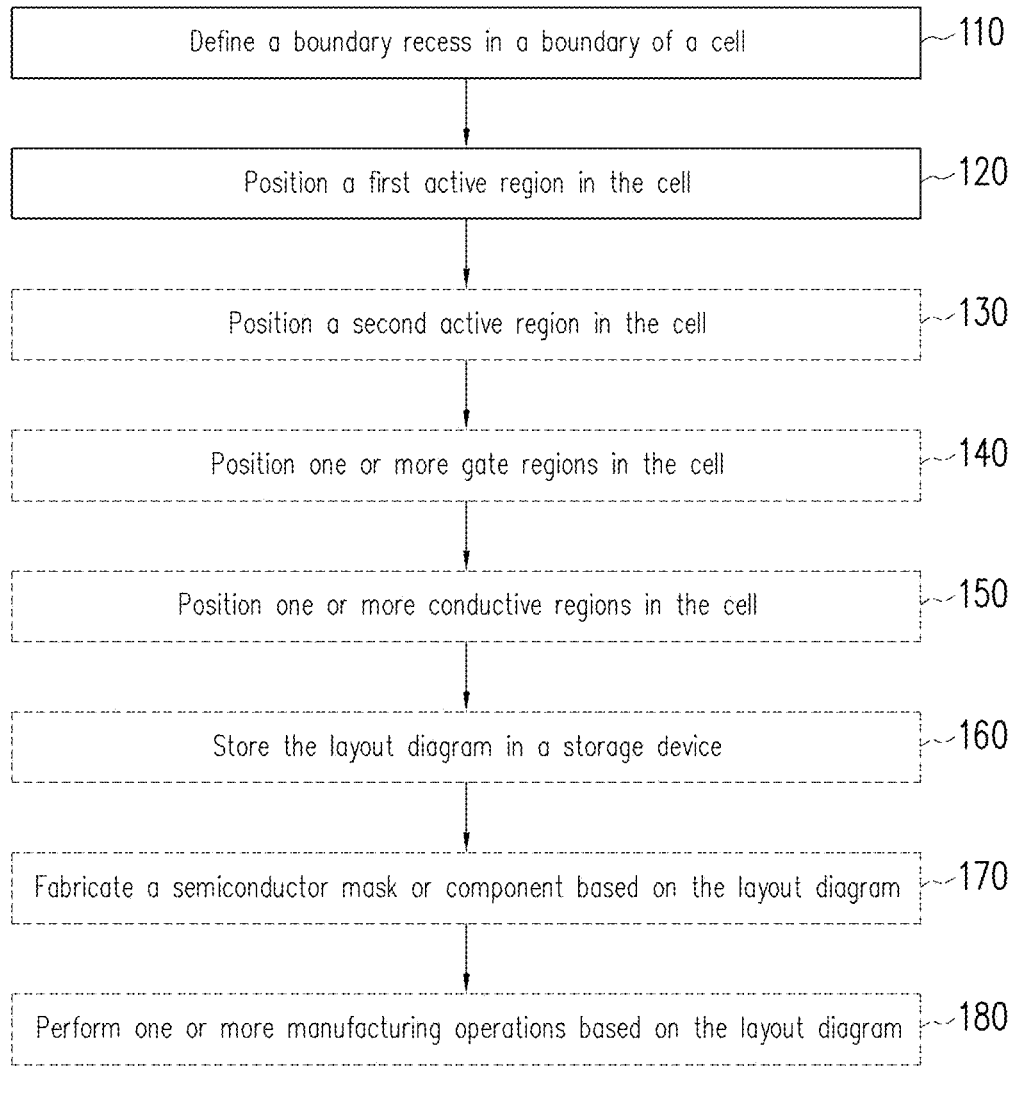
FIG. 1 is a flowchart of a method of generating a layout diagram of an IC, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC layout includes a first cell having a boundary protrusion on one side and a second cell having a compatible boundary recess on a side proximal to the first cell so that, when the cells are abutted in a layout method, the protrusion fits within the recess. The resultant layout is thereby capable of having a gate region used to define a transistor by intersecting an active region in the protrusion of the first cell and extending into the second cell. The IC layouts of the various embodiments, and IC devices based on the IC layouts, avoid the use of dummy gate regions at cell boundaries, thereby reducing area requirements compared to approaches that do not include a gate region capable of defining a transistor in a first cell and extending into a second cell.

FIG. 1 is a flowchart of a method 100 of generating a layout diagram of an IC, in accordance with some embodiments. The operations of method 100 are capable of being performed as part of a method of forming one or more IC devices, e.g., one of IC devices 1100 or 1200 discussed below with respect to FIGS. 11 and 12, respectively, manufactured based on the generated IC layout diagram. Non-limiting examples of IC devices include memory circuits, logic devices, processing devices, signal processing circuits, and the like.

In some embodiments, some or all of the operations of method 100 are capable of being performed as part of an automated placement and routing (APR) method. In some embodiments, some or all of the operations of method 100 are capable of being performed by an APR system, e.g., a system included in an EDA system 1300, discussed below with respect to FIG. 13, and configured to perform the APR method.

In some embodiments, some or all of the operations of method 100 are performed as part of a method 600 of generating a layout diagram of an IC discussed below with respect to FIG. 6. Some or all of the operations of method 100 are capable of being performed as part of a design procedure performed in a design house, e.g., a design house 1420 discussed below with respect to FIG. 14.

In some embodiments, some or all of the operations of method 100 are executed by a processor of a computer. In some embodiments, some or all of the operations of method 100 are executed by a processor 1302 of EDA system 1300, discussed below with respect to FIG. 13.

In some embodiments, the operations of method 100 are performed in the order depicted in FIG. 1. In some embodiments, the operations of method 100 are performed in an order other than the order depicted in FIG. 1. In some embodiments, one or more operations are performed before, between, during, and/or after performing one or more operations of method 100.

FIGS. 2-4 and 5B1-5H2 are depictions of non-limiting examples of respective IC layout diagrams 200-400 and 500B1-500H2 generated by executing one or more operations of method 100, in some embodiments. IC layout diagrams 200-400 and 500B1-500H2 are simplified for the purpose of clarity. In various embodiments, one or more of IC layout diagrams 200-400 and 500B1-500H2 includes features in addition to those depicted in FIGS. 2-4 and 5B1-5H2, e.g., one or more transistor elements, power rails, isolation structures, wells, conductive elements, or the like.

Each of FIGS. 2-4 and 5B1-5H2 further depicts an X direction and a Y direction perpendicular to the X direction. The X direction being depicted as horizontal and the Y direction being depicted as vertical are a non-limiting example for the purpose of illustration. In various embodiments, the X and Y directions are perpendicular to each other and have orientations other than those depicted in FIGS. 2-4 and 5B1-5H2.

The X direction includes a positive X direction depicted in FIGS. 2-4 and 5B1-5H2 and a negative X direction (not labeled) opposite to the positive X direction. The Y direction includes a positive Y direction depicted in FIGS. 2-4 and 5B1-5H2 and a negative Y direction (not labeled) opposite to the positive Y direction.

Figure 2:
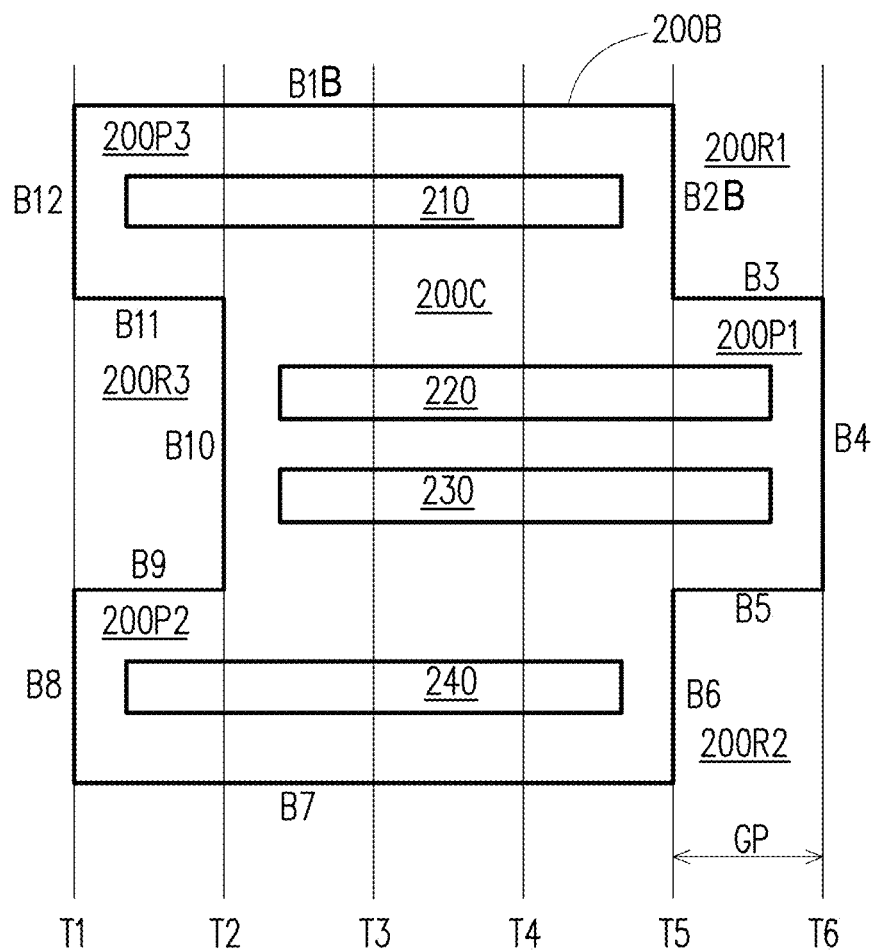
FIG. 2 is a depiction of an IC layout diagram, in accordance with some embodiments.

FIG. 2 is a depiction of IC layout diagram 200 including a cell 200C, in accordance with some embodiments. Cell 200C includes a boundary 200B and active regions 210, 220, 230, and 240.

Figure 3:
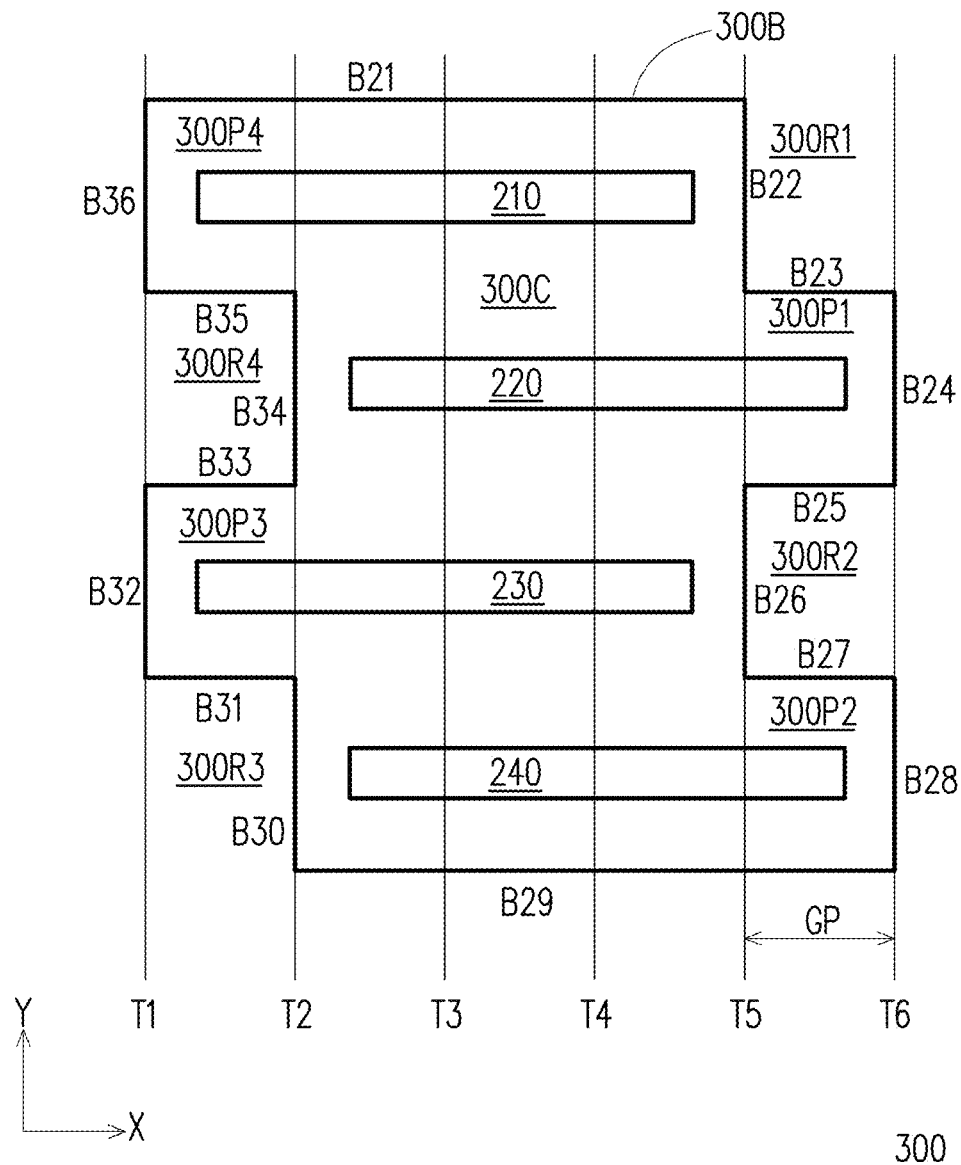
FIG. 3 is a depiction of an IC layout diagram, in accordance with some embodiments.

FIG. 3 is a depiction of IC layout diagram 300 including a cell 300C, in accordance with some embodiments. Cell 300C includes a boundary 300B and active regions 210, 220, 230, and 240.

In addition to cells 200C and 300C, each of FIGS. 2 and 3 depicts gate tracks T1 through T6. Gate tracks T1 through T6 extend in the Y direction, have a gate pitch GP in the X direction, and correspond to locations at which gate regions (not shown) are aligned in IC layout diagrams, e.g., IC layout diagrams 200 and 300.

In various embodiments, one or both of IC layout diagrams 200 or 300 includes one or more cells (not shown) in addition to respective cell 200C or cell 300C.

In various embodiments, one or both of cell 200C or cell 300C is a layout diagram of a standard cell, a custom cell, an engineering change order (ECO) cell, a logic gate cell, a memory cell, or another type of cell or combination of cells capable of being defined in an IC layout diagram. In various embodiments, a logic gate cell includes a layout diagram of one or more of an AND, OR, NAND, NOR, XOR, INV, AND-OR-Invert (AOI), OR-AND-Invert (AOI), MUX, Flip-flop, BUFF, Latch, delay, or clock device. In various embodiments, a memory cell includes a layout diagram of one or more of a static random access memory (SRAM), a dynamic RAM (DRAM), a resistive RAM (RRAM), a magnetoresistive RAM (MRAM), or read only memory (ROM) cell, or another device capable of having multiple states representative of logical values.

As depicted in FIG. 2, boundary 200B of cell 200C includes portions B1B through B12. Portion B12 extends along the Y direction and is contiguous with portion B1B, which extends along the X direction. For each of the other portions B2B through B11, a given portion B[n] is contiguous with a portion B[n−1], contiguous with a portion B[n+1], and extends along one of the X or Y direction perpendicular to the other of the X or Y direction along which each of portions B[n−1] and B[n+1] extends.

Portion B1B extends in the positive X direction from a point corresponding to gate track T1 to a point corresponding to gate track T5. Portion B2B extends along gate track T5 in the negative Y direction from portion B1B to portion B3. In various embodiments, portion B1B extends from a location other than the point corresponding to gate track T1 and/or portion B1B extends to a location other than the point corresponding to gate track T5 and portion B2B extends along a location other than that of gate track T5.

Portion B3 extends in the positive X direction from portion B2B to a point corresponding to gate track T6. Portion B4 extends along gate track T6 in the negative Y direction from portion B3 to portion B5. In various embodiments, portion B3 extends from a location other than the point corresponding to gate track T5 and/or portion B3 extends to a location other than the point corresponding to gate track T6 and portion B4 extends along a location other than that of gate track T6.

Portion B5 extends in the negative X direction from portion B4 to a point corresponding to gate track T5. Portion B6 extends along gate track T5 in the negative Y direction from portion B5 to portion B7. In various embodiments, portion B5 extends from a location other than the point corresponding to gate track T6 and/or portion B5 extends to a location other than the point corresponding to gate track T5 and portion B6 extends along a location other than that of gate track T5.

Portion B7 extends in the negative X direction from portion B6 to a point corresponding to gate track T1. Portion B8 extends along gate track T1 in the positive Y direction from portion B7 to portion B9. In various embodiments, portion B7 extends from a location other than the point corresponding to gate track T5 and/or portion B7 extends to a location other than the point corresponding to gate track T1 and portion B8 extends along a location other than that of gate track T1.

Portion B9 extends in the positive X direction from portion B8 to a point corresponding to gate track T2. Portion B10 extends along gate track T2 in the positive Y direction from portion B9 to portion B11. In various embodiments, portion B9 extends from a location other than the point corresponding to gate track T1 and/or portion B9 extends to a location other than the point corresponding to gate track T2 and portion B10 extends along a location other than that of gate track T2.

Portion B11 extends in the negative X direction from portion B10 to a point corresponding to gate track T1. Portion B12 extends along gate track T1 in the positive Y direction from portion B11 to portion B1B. In various embodiments, portion B11 extends from a location other than the point corresponding to gate track T2 and/or portion B11 extends to a location other than the point corresponding to gate track T1 and portion B12 extends along a location other than that of gate track T1.

In the embodiment depicted in FIG. 2, each of portions B1B, B3, B5, B7, B9, and B11 extends in the X direction. In various embodiments, one or more of portions B1B, B3, B5, B7, B9, or B11 extends in a direction other than the X direction and includes a component in the X direction.

In the embodiment depicted in FIG. 2, each of portions B2B, B4, B6, B8, B10, and B12 extends in the Y direction. In various embodiments, one or more of portions B2B, B4, B6, B8, B10, or B12 extends in a direction other than the Y direction and includes a component in the Y direction.

In the embodiment depicted in FIG. 2, portion B2B aligns with portion B6 along the Y direction, portion B3 aligns with portion B11 along the X direction, portion B5 aligns with portion B9 along the X direction, and portion B8 aligns with portion B12 along the Y direction. In various embodiments, one or more of portion B2B does not align with portion B6 along the Y direction, portion B3 does not align with portion B11 along the X direction, portion B5 does not align with portion B9 along the X direction, or portion B8 does not align with portion B12 along the Y direction.

A boundary having a shape other than a rectangular shape is considered to have one or more protrusions and/or one or more recesses based on one or more deviations from a rectangular shape. By the configuration of boundary 200B discussed above, portions B3, B4, and B5 have a shape of a boundary protrusion 200P1 of cell 200C, portions B7, B8, and B9 have a shape of a boundary protrusion 200P2 of cell 200C, portions B11, B12, and B1B have a shape of a boundary protrusion 200P3 of cell 200C, portions B2B and B3 have a shape of a boundary recess 200R1 of cell 200C, portions B5 and B6 have a shape of a boundary recess 200R2 of cell 200C, and portions B9, B10, and B11 have a shape of a boundary recess 200R3 of cell 200C.

In the embodiment depicted in FIG. 2, cell 200C thereby includes two boundary protrusions 200P2 and 200P3 along a left side of cell 200C, one boundary protrusion 200P1 along a right side of cell 200C, zero boundary protrusions along a top of cell 200C, and zero boundary protrusions along a bottom of cell 200C. In various embodiments, cell 200C includes fewer or greater than two boundary protrusions along the left side, greater than one boundary protrusion along the right side, one or more boundary protrusions along the top, and/or one or more boundary protrusions along the bottom.

In the embodiment depicted in FIG. 2, cell 200C thereby includes one boundary recess 200R3 along the left side, two boundary recesses 200R1 and 200R2 along the right side, zero boundary recesses along the top, and zero boundary recesses along the bottom. In various embodiments, cell 200C includes greater than one boundary recess along the left side, fewer or greater than two boundary recesses along the right side, one or more boundary recesses along the top, and/or one or more boundary recesses along the bottom.

In the embodiment depicted in FIG. 2, each of boundary protrusions 200P1, 200P2, and 200P3, and each of boundary recesses 200R1, 200R2, and 200R3 extends in the X direction a distance equivalent to gate pitch GP. In various embodiments, one or more of boundary protrusions 200P1, 200P2, or 200P3 or boundary recesses 200R1, 200R2, or 200R3 extends in the X direction a distance other than gate pitch GP, e.g., a multiple of gate pitch GP or a fraction of gate pitch GP.

In the embodiment depicted in FIG. 2, each of boundary protrusions 200P1, 200P2, and 200P3, and each of boundary recesses 200R1, 200R2, and 200R3 has a shape based on right angles formed by contiguous boundary portions. In various embodiments, one or more of boundary protrusions 200P1, 200P2, or 200P3 or boundary recesses 200R1, 200R2, or 200R3 has a shape based on one or more configurations other than a right angle formed by contiguous boundary portions, e.g., an acute or obtuse angle formed by contiguous boundary portions, a semicircular boundary portion, or a boundary portion including one or more arcs.

As depicted in FIG. 3, boundary 300B of cell 300C includes portions B21 through B36. Portion B36 extends along the Y direction and is contiguous with portion B21, which extends along the X direction. For each of the other portions B22 through B35, a given portion B[n] is contiguous with a portion B[n−1], contiguous with a portion B[n+1], and extends along one of the X or Y direction perpendicular to the other of the X or Y direction along which each of portions B[n−1] and B[n+1] extends.

Portion B21 extends in the positive X direction from a point corresponding to gate track T1 to a point corresponding to gate track T5. Portion B22 extends along gate track T5 in the negative Y direction from portion B21 to portion B23. In various embodiments, portion B21 extends from a location other than the point corresponding to gate track T1 and/or portion B21 extends to a location other than the point corresponding to gate track T5 and portion B22 extends along a location other than that of gate track T5.

Portion B23 extends in the positive X direction from portion B22 to a point corresponding to gate track T6. Portion B24 extends along gate track T6 in the negative Y direction from portion B23 to portion B25. In various embodiments, portion B23 extends from a location other than the point corresponding to gate track T5 and/or portion B23 extends to a location other than the point corresponding to gate track T6 and portion B24 extends along a location other than that of gate track T6.

Portion B25 extends in the negative X direction from portion B24 to a point corresponding to gate track T5. Portion B26 extends along gate track T5 in the negative Y direction from portion B25 to portion B27. In various embodiments, portion B25 extends from a location other than the point corresponding to gate track T6 and/or portion B25 extends to a location other than the point corresponding to gate track T5 and portion B26 extends along a location other than that of gate track T5.

Portion B27 extends in the positive X direction from portion B26 to a point corresponding to gate track T6. Portion B28 extends along gate track T6 in the negative Y direction from portion B27 to portion B29. In various embodiments, portion B27 extends from a location other than the point corresponding to gate track T5 and/or portion B27 extends to a location other than the point corresponding to gate track T6 and portion B28 extends along a location other than that of gate track T6.

Portion B29 extends in the negative X direction from portion B28 to a point corresponding to gate track T2. Portion B30 extends along gate track T2 in the positive Y direction from portion B29 to portion B31. In various embodiments, portion B29 extends from a location other than the point corresponding to gate track T6 and/or portion B29 extends to a location other than the point corresponding to gate track T2 and portion B30 extends along a location other than that of gate track T2.

Portion B31 extends in the negative X direction from portion B30 to a point corresponding to gate track T1. Portion B32 extends along gate track T1 in the positive Y direction from portion B31 to portion B33. In various embodiments, portion B31 extends from a location other than the point corresponding to gate track T2 and/or portion B31 extends to a location other than the point corresponding to gate track T1 and portion B32 extends along a location other than that of gate track T1.

Portion B33 extends in the positive X direction from portion B32 to a point corresponding to gate track T2. Portion B34 extends along gate track T2 in the positive Y direction from portion B33 to portion B35. In various embodiments, portion B33 extends from a location other than the point corresponding to gate track T1 and/or portion B33 extends to a location other than the point corresponding to gate track T2 and portion B34 extends along a location other than that of gate track T2.

Portion B35 extends in the negative X direction from portion B34 to a point corresponding to gate track T1. Portion B36 extends along gate track T1 in the positive Y direction from portion B35 to portion B21. In various embodiments, portion B35 extends from a location other than the point corresponding to gate track T2 and/or portion B35 extends to a location other than the point corresponding to gate track T1 and portion B36 extends along a location other than that of gate track T1.

In the embodiment depicted in FIG. 3, each of portions B21, B23, B25, B27, B29, B31, B33, and B35 extends in the X direction. In various embodiments, one or more of portions B21, B23, B25, B27, B29, B31, B33, or B35 extends in a direction other than the X direction and includes a component in the X direction.

In the embodiment depicted in FIG. 3, each of portions B22, B24, B26, B28, B30, B32, B34, and B36 extends in the Y direction. In various embodiments, one or more of portions B22, B24, B26, B28, B30, B32, B34, or B36 extends in a direction other than the Y direction and includes a component in the Y direction.

In the embodiment depicted in FIG. 3, portion B22 aligns with portion B26 along the Y direction, portion B23 aligns with portion B35 along the X direction, portion B24 aligns with portion B28 along the Y direction, portion B25 aligns with portion B33 along the X direction, portion B27 aligns with portion B31 along the X direction, portion B30 aligns with portion B34 along the Y direction, and portion B32 aligns with portion B36 along the Y direction. In various embodiments, one or more of portion B22 does not align with portion B26 along the Y direction, portion B23 does not align with portion B35 along the X direction, portion B24 does not align with portion B28 along the Y direction, portion B25 does not align with portion B33 along the X direction, portion B27 does not align with portion B31 along the X direction, portion B30 does not align with portion B34 along the Y direction, or portion B32 does not align with portion B36 along the Y direction.

By the configuration of border 300B discussed above, portions B23, B24, and B25 have a shape of a boundary protrusion 300P1 of cell 300C, portions B27, B28, and B29 have a shape of a boundary protrusion 300P2 of cell 300C, portions B31, B32, and B33 have a shape of a boundary protrusion 300P3 of cell 300C, portions B35, B36, and B21 have a shape of a boundary protrusion 300P4 of cell 300C, portions B22 and B23 have a shape of a boundary recess 300R1 of cell 300C, portions B25, B26, and B27 have a shape of a boundary recess 300R2 of cell 300C, portions B30 and B31 have a shape of a boundary recess 300R3 of cell 300C, and portions B33, B34, and B35 have a shape of a boundary recess 300R4 of cell 300C.

In the embodiment depicted in FIG. 3, cell 300C thereby includes two boundary protrusions 300P3 and 300P4 along a left side of cell 300C, two boundary protrusions 300P1 and 300P2 along a right side of cell 300C, zero boundary protrusions along a top of cell 300C, and zero boundary protrusions along a bottom of cell 300C. In various embodiments, cell 300C includes fewer or greater than two boundary protrusions along the left side, fewer or greater than two boundary protrusions along the right side, one or more boundary protrusions along the top, and/or one or more boundary protrusions along the bottom.

In the embodiment depicted in FIG. 3, cell 300C thereby includes two boundary recesses 300R3 and 300R4 along the left side, two boundary recesses 300R1 and 300R2 along the right side, zero boundary recesses along the top, and zero boundary recesses along the bottom. In various embodiments, cell 300C includes fewer or greater than two boundary recesses along the left side, fewer or greater than two boundary recesses along the right side, one or more boundary recesses along the top, and/or one or more boundary recesses along the bottom.

In the embodiment depicted in FIG. 3, each of boundary protrusions 300P1, 300P2, 300P3, and 300P4, and each of boundary recesses 300R1, 300R2, 300R3, and 300R4 extends in the X direction a distance equivalent to gate pitch GP. In various embodiments, one or more of boundary protrusions 300P1, 300P2, 300P3, or 300P4 or boundary recesses 300R1, 300R2, 300R3, or 300R4 extends in the X direction a distance other than gate pitch GP, e.g., a multiple of gate pitch GP or a fraction of gate pitch GP.

In the embodiment depicted in FIG. 3, each of boundary protrusions 300P1, 300P2, 300P3, and 300P4 and each of boundary recesses 300R1, 300R2, 300R3, and 300R4 has a shape based on right angles formed by contiguous boundary portions. In various embodiments, one or more of boundary protrusions 300P1, 300P2, 300P3, or 300P4 or boundary recesses 300R1, 300R2, 300R3, or 300R4 has a shape based on one or more configurations other than a right angle formed by contiguous boundary portions, e.g., an acute or obtuse angle formed by contiguous boundary portions, a semicircular boundary portion, or a boundary portion including one or more arcs.

At operation 110, a boundary recess in a boundary of an IC cell is defined. Defining the boundary recess includes extending a first portion of the boundary along a first direction, extending a second portion of the boundary away from the first portion in a second direction perpendicular to the first direction, the second portion being contiguous with the first portion, and extending a third portion away from the first portion in the second direction, the third portion being contiguous with the first portion.

Extending the first portion in the first direction and the second and third portions in the second direction forms a first recess in the boundary. In some embodiments, defining the boundary recess includes forming one or more boundary recesses in addition to the first boundary recess. In various embodiments, defining the boundary recess includes forming one or more protrusions in the boundary.

In some embodiments, defining the boundary recess includes forming an entirety of the boundary having a closed loop. In various embodiments, defining the boundary recess includes forming an entirety of one of boundaries 200B or 300B, discussed above with respect to FIGS. 2 and 3, respectively.

In some embodiments, defining the boundary recess includes defining at least some of boundary 200B of cell 200C, extending the first portion in the first direction includes extending portion B10 in the positive or negative Y direction, extending the second and third portions in the second direction includes extending portions B9 and B11 in the negative X direction, thereby forming boundary recess 200R3, discussed above with respect to FIG. 2.

In some embodiments, defining the boundary recess includes defining at least some of boundary 300B of cell 300C, extending the first portion in the first direction includes extending portion B34 in the positive or negative Y direction, extending the second and third portions in the second direction includes extending portions B33 and B35 in the negative X direction, thereby forming boundary recess 300R4, discussed above with respect to FIG. 3.

In some embodiments, defining the boundary recess includes defining at least some of boundary 300B of cell 300C, extending the first portion in the first direction includes extending portion B26 in the positive or negative Y direction, extending the second and third portions in the second direction includes extending portions B25 and B27 in the positive X direction, thereby forming boundary recess 300R2, discussed above with respect to FIG. 3.

In various embodiments, defining the boundary recess includes further defining the boundary by extending one or more additional portions along the first or second direction or along one or more directions opposite to the first or second direction.

In some embodiments, further defining the boundary includes forming an entirety of the boundary having a closed loop. In various embodiments, further defining the boundary includes forming an entirety of one of boundaries 200B or 300B, discussed above with respect to FIGS. 2 and 3, respectively.

In some embodiments, further defining the boundary includes forming one or more boundary recesses in addition to the first boundary recess. In some embodiments, further defining the boundary includes forming one or both of boundary recesses 200R1 or 200R2, discussed above with respect to FIG. 2. In some embodiments, further defining the boundary includes forming one or more of boundary recesses 300R1, 300R2, 300R3, or 300R4, discussed above with respect to FIG. 3.

In some embodiments, further defining the boundary includes forming one or more protrusions in the boundary. In some embodiments, further defining the boundary includes forming one or more of boundary protrusions 200P1, 200P2, or 200P3, discussed above with respect to FIG. 2. In some embodiments, further defining the boundary includes forming one or more of boundary protrusions 300P1, 300P2, 300P3, or 300P4, discussed above with respect to FIG. 3.

Each of active regions 210, 220, 230, and 240 is a layout component that extends along the X direction and defines an active area of one or more transistor structures formed at one or more locations at which active regions 210, 220, 230, and 240 intersect gate tracks T1 through T6. In various embodiments, a transistor structure includes one or more of a switching, logic, amplification, rectification, storage, or other IC device.

Each of active regions 210, 220, 230, and 240 defines an active area in which source, drain, and channel features of one or more transistor structures are formed in and/or on a semiconductor substrate. A given active region 210, 220, 230, or 240 is either a p-type active region that defines a p-type active area of one or more PMOS transistor structures or an n-type active region that defines an n-type active area of one or more NMOS transistor structures. In some embodiments, each of active regions 210 and 220 defines a p-type active area of one or more PMOS transistor structures, and each of active regions 230 and 240 defines an n-type active area of one or more NMOS transistor structures.

In various embodiments, one or more of active regions 210, 220, 230, or 240 includes a single, continuous active region or a plurality of active regions. In some embodiments, each of active regions 210, 220, 230, and 240 includes a same number of active regions. In various embodiments, one or more of active regions 210, 220, 230, or 240 includes a number of active regions that differs from a number of active regions included in another one or more of active regions 210, 220, 230, or 240.

In various embodiments, one or more of active regions 210, 220, 230, or 240 is included in one or more planar transistors and/or one or more fin, field-effect transistors (FinFETs) in one or both of cell 200C or cell 300C. In some embodiments, one or more of active regions 210, 220, 230, or 240 is active region 400, discussed below with respect to FIG. 4.

In the embodiments depicted in FIGS. 2 and 3, each of active regions 210, 220, 230, and 240 extends across three of gate tracks T2 through T5. In various embodiments, one or more of active regions 210, 220, 230, or 240 extends across fewer than three of gate tracks T2 through T5, greater than three of gate tracks T2 through T5, or across one or more gate tracks other than gate tracks T2 through T5.

In the embodiment depicted in FIG. 2, active region 210 is located between portions B12 and B2B, is aligned with portions B12 and B2B along the X direction, and extends into protrusion 200P3, and spaces (not labeled) separate active region 210 from each of portions B12 and B2B. In various embodiments, active region 210 abuts one or both of portions B12 or B2B and/or is aligned with one or both of gate tracks T1 or T5.

In some embodiments, cell 200C includes one or more active regions (not shown) in addition to active region 210 that is located between portions B12 and B2B, aligned with portions B12 and B2B along the X direction, and extends into protrusion 200P3.

In the embodiment depicted in FIG. 2, each of active regions 220 and 230 is located between portions B10 and B4, is aligned with portions B10 and B4 along the X direction, and extends into protrusion 200P1, and spaces (not labeled) separate each of active regions 220 and 230 from each of portions B10 and B4. In various embodiments, one or both of active regions 220 or 230 abuts one or both of portions B10 or B4 and/or is aligned with one or both of gate tracks T2 or T6.

In some embodiments, cell 200C includes one or more other active regions (not shown) in addition to active regions 220 and 230 that is located between portions B10 and B4, aligned with portions B10 and B4 along the X direction, and extends into protrusion 200P1. In some embodiments, cell 200C does not include one of active regions 220 or 230 and one of active regions 220 or 230 is a single active region located between portions B10 and B4, aligned with portions B10 and B4 along the X direction, and extending into protrusion 200P1.

In the embodiment depicted in FIG. 2, active region 240 is located between portions B8 and B6, is aligned with portions B8 and B6 along the X direction, and extends into protrusion 200P2, and spaces (not labeled) separate active region 240 from each of portions B8 and B6. In various embodiments, active region 240 abuts one or both of portions B8 or B6 and/or is aligned with one or both of gate tracks T1 or T5.

In some embodiments, cell 200C includes one or more active regions (not shown) in addition to active region 240 that is located between portions B8 and B6, aligned with portions B8 and B6 along the X direction, and extends into protrusion 200P2.

In the embodiment depicted in FIG. 3, active region 210 is located between portions B36 and B22, is aligned with portions B36 and B22 along the X direction, and extends into protrusion 300P4, and spaces (not labeled) separate active region 210 from each of portions B36 and B22. In various embodiments, active region 210 abuts one or both of portions B36 or B22 and/or is aligned with one or both of gate tracks T1 or T5.

In some embodiments, cell 300C includes one or more active regions (not shown) in addition to active region 210 that is located between portions B36 and B22, aligned with portions B36 and B22 along the X direction, and extends into protrusion 300P4.

In the embodiment depicted in FIG. 3, active region 220 is located between portions B34 and B24, is aligned with portions B34 and B24 along the X direction, and extends into protrusion 300P1, and spaces (not labeled) separate active region 220 from each of portions B34 and B24. In various embodiments, active region 220 abuts one or both of portions B34 or B24 and/or is aligned with one or both of gate tracks T2 or T6.

In some embodiments, cell 300C includes one or more active regions (not shown) in addition to active region 220 that is located between portions B34 and B24, aligned with portions B34 and B24 along the X direction, and extends into protrusion 300P1.

In the embodiment depicted in FIG. 3, active region 230 is located between portions B32 and B26, is aligned with portions B32 and B26 along the X direction, and extends into protrusion 300P3, and spaces (not labeled) separate active region 230 from each of portions B32 and B26. In various embodiments, active region 230 abuts one or both of portions B32 or B26 and/or is aligned with one or both of gate tracks T1 or T5.

In some embodiments, cell 300C includes one or more active regions (not shown) in addition to active region 230 that is located between portions B32 and B26, aligned with portions B32 and B26 along the X direction, and extends into protrusion 300P3.

In the embodiment depicted in FIG. 3, active region 240 is located between portions B30 and B28, is aligned with portions B30 and B28 along the X direction, and extends into protrusion 300P2, and spaces (not labeled) separate active region 240 from each of portions B30 and B28. In various embodiments, active region 240 abuts one or both of portions B30 or B28 and/or is aligned with one or both of gate tracks T2 or T6. [96] In some embodiments, cell 300C includes one or more active regions (not shown) in addition to active region 240 that is located between portions B30 and B28, aligned with portions B30 and B28 along the X direction, and extends into protrusion 300P2.

Figure 4:
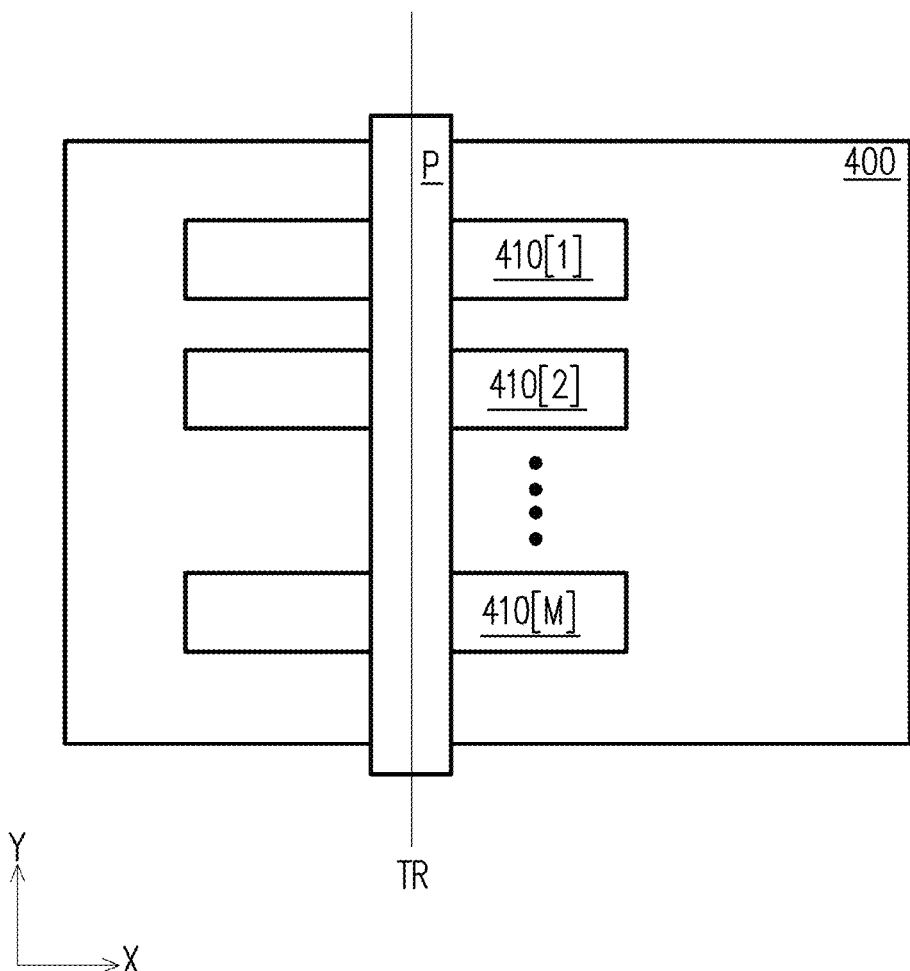
FIG. 4 is a depiction of an active region, in accordance with some embodiments.

FIG. 4 is a depiction of an active region 400, in accordance with some embodiments. Active region 400 is usable as one or more of active regions 210, 220, 230, or 240, discussed above with respect to FIGS. 2 and 3. In addition to active region 400, FIG. 4 depicts the X and Y directions, discussed above with respect to FIGS. 2 and 3, a gate track TR, and a gate region P. In some embodiments, gate track TR corresponds to one of gate tracks T1 through T6, discussed above with respect to FIGS. 2 and 3.

Active region 400 includes a number M of active lines 410[1] . . . 410[M]. Each active line 410[1] . . . 410[M] extends along the X direction and defines, at least in part, a fin structure of a FinFET. In some embodiments, each active line 410[1] . . . 410[M] is an active area separate from each other active line 410[1] . . . 410[M]. In some embodiments, two or more of active lines 410[1] . . . 410[M] are part of a same active area.

In various embodiments, active region 400 includes the number M of active lines 410[1] . . . 410[M] ranging from one to four. In some embodiments, region 400 includes the number M of active lines 410[1] . . . 410[M] greater than four. Because both a current capacity of the FinFET and an area occupied by the FinFET increase as the number M of active lines 410[1] . . . 410[M] increases, the number M is based on current and area design criteria for an IC that includes active region 400, in some cases.

Gate region P extends along the Y direction, is located at gate track TR, and intersects each active line 410[1] . . . 410[M]. Gate region P defines, at least in part, a gate electrode of a gate structure included in the FinFET. In various embodiments, gate region P defines, at least in part, a gate electrode including one or more of a polysilicon layer, a metal layer, a work function layer, or another material suitable for controlling a channel of a FinFET.

At operation 120, a first active region is positioned in the cell by extending the first active region away from the first portion in a third direction opposite to the second direction. In some embodiments, positioning the first active region in the cell includes revising the layout diagram. Extending the first active region away from the first portion in the third direction is based on positioning the first active region by aligning the first active region and the first portion in the second and third directions.

Because the second and third portions of the boundary are extended away from the first portion in the second direction, extending the first active region in third direction opposite to the second direction causes the first active region to be positioned within the cell boundary and aligned with the first boundary recess in the second and third directions.

In some embodiments, the second direction corresponds to the negative X direction and the third direction corresponds to the positive X direction, each discussed above with respect to FIGS. 2-4 and 5B1-5H2.

In some embodiments, positioning the first active region in the cell includes positioning the first active region within a protrusion of the cell boundary. In various embodiments, positioning the first active region in the cell includes positioning the first active region within one of boundary protrusions 200P1, 200P2, or 200P3, discussed above with respect to FIG. 2, or within one or more of boundary protrusions 300P1, 300P2, 300P3, or 300P4, discussed above with respect to FIG. 3.

In some embodiments, positioning the first active region in the cell includes positioning the first active region to be non-overlapping with a boundary recess of the cell. In various embodiments, positioning the first active region in the cell includes positioning the first active region to be non-overlapping with one or more of boundary recesses 200R1, 200R2, or 200R3, discussed above with respect to FIG. 2, or non-overlapping with one or more of boundary recesses 300R1, 300R2, 300R3, or 300R4, discussed below with respect to FIG. 3.

In various embodiments, positioning the first active region includes positioning one or more of active regions 210-240 in one of cells 200C or 300C, discussed above with respect to FIGS. 2 and 3. In some embodiments, positioning the first active region includes positioning active region 400, discussed above with respect to FIG. 4.

At operation 130, in some embodiments, a second active region is positioned in the cell. Positioning the second active region includes positioning the second active region along the second and third directions, thereby in parallel with the first active region. In various embodiments, positioning the second active region includes aligning one, both, or neither of a first or second endpoint of the second active region with a first or second endpoint of the first active region along the first direction.

In various embodiments, positioning the second active region includes positioning the second active region defining one of an N-type or P-type active area the same or different as an active area defined by the first active region.

In various embodiments, positioning the second active region in the cell includes positioning one or more of active regions 210-240 in one of cells 200C or 300C, discussed above with respect to FIGS. 2 and 3. In some embodiments, positioning the second active region includes positioning active region 400, discussed above with respect to FIG. 4.

In some embodiments, positioning the second active region in the cell includes positioning the second active region within a protrusion of the cell boundary. In various embodiments, positioning the second active region in the cell includes positioning the second active region within one of protrusions 200P1, 200P2, or 200P3, discussed above with respect to FIG. 2, or within one or more of protrusions 300P1, 300P2, 300P3, or 300P4, discussed above with respect to FIG. 3.

In some embodiments, positioning the second active region in the cell includes positioning the second active region to be non-overlapping with a boundary recess of the cell. In various embodiments, positioning the second active region in the cell includes positioning the second active region to be non-overlapping with one or more of boundary recesses 200R1, 200R2, or 200R3, discussed above with respect to FIG. 2, or non-overlapping with one or more of boundary recesses 300R1, 300R2, 300R3, or 300R4, discussed below with respect to FIG. 3.

In some embodiments, positioning the second active region includes revising the IC layout diagram.

Figure 5A:
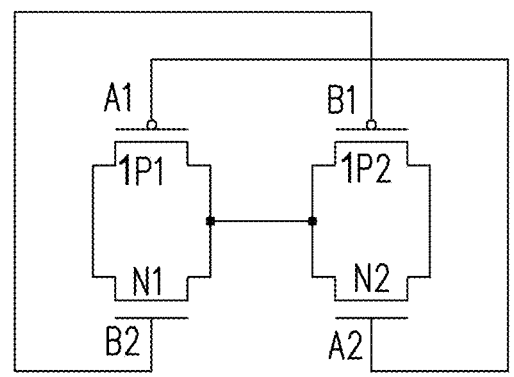
FIG. 5A is a schematic representation of an IC corresponding to IC layout diagrams, in accordance with some embodiments.

FIG. 5A is a schematic representation of an IC 500 corresponding to IC layout diagrams 500B1-500H2 depicted in FIGS. 5B1-5H2, respectively, in accordance with some embodiments. IC 500 is a transmission gate circuit and each of IC layout diagrams 500B1-500H2 is a non-limiting example of a corresponding IC layout diagram generated by executing one or more operations of method 100, in some embodiments.

IC 500 includes a PMOS transistor 1P1 having a gate terminal A1, a PMOS transistor 1P2 having a gate terminal B1, an NMOS transistor N1 having a gate terminal B2, and an NMOS transistor N2 having a gate terminal A2. Gate terminal A1 is electrically connected to gate terminal A2, and gate terminal B1 is electrically connected to gate terminal B2.

First source/drain terminals of transistors 1P1, 1P2, N1, and N2 are electrically connected to each other. A second source/drain terminal of transistor 1P1 is electrically connected to a second source/drain terminal of transistor N1, and a second source/drain terminal of transistor 1P2 is electrically connected to a second source/drain terminal of transistor N2.

FIGS. 5B1, 5C1, 5D1, 5E1, 5F1, 5G1, and 5H1 depict respective IC layout diagrams 500B1, 500C1, 500D1, 500E1, 500F1, 500G1, and 500H1, each based on cell 200C, discussed above with respect to FIG. 2. FIGS. 5B2, 5C2, 5D2, 5E2, 5F2, 5G2, and 5H2 depict respective IC layout diagrams 500B2, 500C2, 500D2, 500E2, 500F2, 500G2, and 500H2, each based on cell 300C, discussed above with respect to FIG. 3.

Each of FIGS. 5B1-5H2 depicts one of respective IC layout diagrams 500B1-500H2 including active regions 210-240 positioned in accordance with one of cells 200C or 300C, but does not depict either of boundaries 200B or 300B for the purpose of clarity. In addition to active regions 210-240, each IC layout diagram 500B1-500H2 includes gate terminals A1, A2, B1, and B2 and additional IC layout elements that define electrical connections to and within an IC device, e.g., one of IC devices 1100 or 1200 discussed below with respect to FIGS. 11 and 12, manufactured based on the respective IC layout diagram 500B1-500H2 and corresponding to IC 500.

In the various embodiments depicted in FIGS. 5B1-5H2, the additional IC layout elements include gate regions P1-P5, conductive regions MD1-MD5, and conductive regions M1 and M2 extending along the Y direction, conductive regions M01-M07B and a cut poly region CP extending along the X direction, vias V0 and V1.

Each gate region P1-P5 defines, at least in part, a gate electrode of a gate structure included in a transistor structure. In various embodiments, one or more of gate regions P1-P5 defines, at least in part, a gate electrode of a FET, a FinFET, or a dummy device. In various embodiments, one or more of gate regions P1-P5 defines, at least in part, a gate electrode including one or more of a polysilicon layer, a metal layer, a work function layer, or another material suitable for controlling a channel of a transistor.

Gate regions P1-P5 are positioned at locations corresponding to subsets of tracks T1-T6, discussed above with respect to FIGS. 2 and 3.

Each conductive region MD1-MD5 defines, at least in part, a segment of a conductive layer electrically connected to an underlying active region. In some embodiments, one or more of conductive regions MD1-MD5 is referred to as a metal diffusion region. In various embodiments, one or more of conductive regions MD1-MD5 defines, at least in part, a segment of a conductive layer including copper or another metal suitable for forming an electrical connection to an underlying active region.

Conductive regions MD1-MD5 are positioned at locations parallel to, and separate from, locations at which gate regions P1-P5 are positioned.

Each conductive region M1 and M2 defines, at least in part, a segment of a conductive layer overlying the other additional elements of the IC device. In some embodiments, conductive regions M1 and M2 define segments in a metal one layer of the IC device. In various embodiments, one or more of conductive regions M1 and M2 defines, at least in part, a segment of a conductive layer including copper or another metal suitable for forming electrical connections in and to the IC device.

Each conductive region M01-M07B defines, at least in part, a segment of a conductive layer overlying segments defined by conductive regions MD1-MD5 and gate electrodes defined by gate regions P1-P5, and underlying segments defined by conductive regions M1 and M2. In some embodiments, conductive regions M01-M07B define segments in a metal zero layer of the IC device. In various embodiments, one or more of conductive regions M01-M07B defines, at least in part, a segment of a conductive layer including copper or another metal suitable for forming electrical connections in the IC device.

Cut poly region CP defines, at least in part, an area in which one or more gate electrodes defined by gate regions P1-P5 are prevented from being formed such that a gate region P1-P5 intersected by cut poly region CP is divided into separately controllable gate electrodes.

Each via V0 (only one of which is labeled for clarity) is a conductive region that defines, at least in part, a segment of a conductive layer between a segment defined by a conductive region M01-M07B and either an underlying segment defined by a conductive region MD1-MD5 or an underlying gate electrode defined by a gate region P1-P5. In various embodiments, one or more of vias V0 defines, at least in part, a segment of a conductive layer including copper or another metal suitable for forming electrical connections in the IC device.

Each via V1 (only one labeled for clarity) is a conductive region that defines, at least in part, a segment of a conductive layer between a segment defined by a conductive region M1 or M2 and an underlying segment defined by a conductive region M01-M07B. In various embodiments, one or more of vias V1 defines, at least in part, a segment of a conductive layer including copper or another metal suitable for forming electrical connections in the IC device.

FIG. 5B1 depicts IC layout diagram 500B1 including cut poly region CP separating gate region P2 into gate terminals A1 and B2, and gate region P3 into gate terminals B1 and A2. Gate terminal A1 is electrically connected to gate terminal A2 through conductive regions M01, MD4, and M05B, and four vias V0. Gate terminal B1 is electrically connected to gate terminal B2 through conductive region M03, gate region P5, conductive region M07, and four vias V0.

FIG. 5B2 depicts IC layout diagram 500B2 including cut poly region CP separating gate region P2 into gate terminals A1 and B2, and gate region P3 into gate terminals B1 and A2. Gate terminal A1 is electrically connected to gate terminal A2 through conductive regions M01, MD4, and M07, and four vias V0. Gate terminal B1 is electrically connected to gate terminal B2 through conductive region M03B, gate region P5, conductive region M05, and four vias V0.

FIG. 5C1 depicts IC layout diagram 500C1 including cut poly region CP separating gate region P2 into gate terminals A1 and B2, and gate region P3 into gate terminals B1 and A2. Gate terminal A1 is electrically connected to gate terminal A2 through conductive region M01, gate region P5, conductive region M05, and four vias V0. Gate terminal B1 is electrically connected to gate terminal B2 through conductive regions M03, MD4, and M07, and four vias V0.

FIG. 5C2 depicts IC layout diagram 500C2 including cut poly region CP separating gate region P2 into gate terminals A1 and B2, and gate region P3 into gate terminals B1 and A2. Gate terminal A1 is electrically connected to gate terminal A2 through conductive region M01, gate region P5, conductive region M07, and four vias V0. Gate terminal B1 is electrically connected to gate terminal B2 through conductive regions M03B, MD4, and M05, and four vias V0.

FIG. 5D1 depicts IC layout diagram 500D1 including cut poly region CP separating gate region P2 into gate terminals A1 and B2, and gate region P3 into gate terminals B1 and A2. Gate terminal A1 is electrically connected to gate terminal A2 through conductive regions M01, M1, M05, two vias V0, and two vias V1. Gate terminal B1 is electrically connected to gate terminal B2 through conductive regions M03, M2, and M07, two vias V0, and two vias V1.

FIG. 5D2 depicts IC layout diagram 500D2 including cut poly region CP separating gate region P2 into gate terminals A1 and B2, and gate region P3 into gate terminals B1 and A2. Gate terminal A1 is electrically connected to gate terminal A2 through conductive regions M01, M1, M07, two vias V0, and two vias V1. Gate terminal B1 is electrically connected to gate terminal B2 through conductive regions M03, M2, and M05, two vias V0, and two vias V1.

FIG. 5E1 depicts IC layout diagram 500E1 including cut poly region CP separating gate region P2 into gate terminals A1 and B2. Gate region P3 corresponds to gate terminal A2, and gate region P4 corresponds to gate terminal B1. Gate terminal A1 is electrically connected to gate terminal A2 through conductive region M01 and two vias V0. Gate terminal B1 is electrically connected to gate terminal B2 through conductive region M07 and two vias V0.

FIG. 5E2 depicts IC layout diagram 500E2 including cut poly region CP separating gate region P2 into gate terminals A1 and B2. Gate region P3 corresponds to gate terminal B1, and gate region P4 corresponds to gate terminal A2. Gate terminal A1 is electrically connected to gate terminal A2 through conductive region M01 and two vias V0. Gate terminal B1 is electrically connected to gate terminal B2 through conductive region M05 and two vias V0.

FIGS. 5F1 and 5F2 depict respective IC layout diagrams 500F1 and 500F2, neither of which includes cut poly region CP. In each of IC layout diagrams 500F1 and 500F2, gate region P3 corresponds to gate terminals A1 and A2, and gate region P4 corresponds to gate terminals B1 and B2.

FIGS. 5G1 and 5G2 depict respective IC layout diagrams 500G1 and 500G2, neither of which includes cut poly region CP. In each of IC layout diagrams 500G1 and 500G2, gate region P2 corresponds to gate terminals A1 and A2, and gate region P3 corresponds to gate terminals B1 and B2.

FIGS. 5H1 and 5H2 depict respective IC layout diagrams 500H1 and 500H2, neither of which includes cut poly region CP. In each of IC layout diagrams 500H1 and 500H2, gate region P2 corresponds to gate terminals A1 and A2, and gate region P3 corresponds to gate terminals B1 and B2.

At operation 140, in some embodiments, one or more gate regions are positioned in the cell. Positioning the one or more gate regions includes positioning the one or more gate regions along the first direction.

Positioning the one or more gate regions includes positioning at least one gate region to intersect at least two active regions of the cell, a third active region of the cell being positioned between the at least two active regions. An active region is considered to intersect a gate region by extending across the gate region and away from the gate region in both the second and third directions.

Positioning the at least one gate region to intersect the at least two active regions includes the third active region extending away from the at least one gate region in only one of the second or third directions. In some embodiments, a gate region of the at least one gate region overlaps an edge of the third active region. In various embodiments, a gate region of the at least one gate region includes a poly on OD (active region) edge (PODE) or continuous PODE (CPODE) region that overlaps an edge of the third active region. In some embodiments, no gate region of the at least one gate region overlaps an edge of the third active region.

In various embodiments, positioning the one or more gate regions includes positioning one or more of gate regions P2-P4, as illustrated in the non-limiting examples depicted in FIGS. 5B1-5H2. In various embodiments, positioning the at least one gate region to intersect the at least two active regions includes positioning gate region P2 or P3 to intersect active regions 210 and 240, as illustrated in the non-limiting examples depicted in FIGS. 5B1, 5C1, 5D1, 5E1, 5F1, 5G1, and 5H1. In various embodiments, positioning the at least one gate region to intersect the at least two active regions includes positioning gate region P2 or P3 to intersect active regions 210 and 230 or positioning gate region P3 or P4 to intersect active regions 210 and 230, as illustrated in the non-limiting examples depicted FIGS. 5B2, 5C2, 5D2, 5E2, 5F2, 5G2, and 5H2.

In various embodiments, positioning the one or more gate regions in the cell includes positioning one or more gate regions in addition to the at least one gate region corresponding to the third active region extending away from the at least one gate region in only one of the second or third directions. In various embodiments, positioning the one or more additional gate regions includes positioning the one or more additional gate regions to intersect the third active region or to have a combination of the configurations discussed above.

In some embodiments, positioning the one or more gate regions includes positioning one or more cut poly regions. Positioning the one or more cut poly regions includes dividing one or more gate regions into two or more sections. In various embodiments, positioning the one or more cut poly regions includes positioning cut poly region CP, as illustrated in the non-limiting examples depicted in FIGS. 5B1-5E2.

In some embodiments, positioning the one or more gate regions includes positioning at least one gate region at a location corresponding to a gate track. In various embodiments, positioning at least one gate region at a location corresponding to a track includes positioning at least one gate region at a location corresponding to at least one of tracks T1-T6, discussed above with respect to FIGS. 2 and 3.

In some embodiments, positioning the one or more gate regions in the cell includes positioning at least one gate region extending into a boundary recess of the cell. In various embodiments, positioning at least one gate region extending into a boundary recess includes positioning at least one gate region extending into one or both of boundary recesses 200R1 or 200R2, or into boundary recess 200R3, discussed above with respect to FIG. 2. In various embodiments, positioning at least one gate region extending into a boundary recess includes positioning at least one gate region extending into one or both of boundary recesses 300R1 or 300R2, or into one or both of boundary recesses 300R3 or 300R4, discussed above with respect to FIG. 3.

In some embodiments, positioning the one or more gate regions in the cell includes positioning at least one gate region within a boundary protrusion of the cell. In various embodiments, positioning at least one gate region within a boundary protrusion includes positioning at least one gate region within boundary protrusion 200P1, or within one or both of boundary protrusions 200P2 or 200P3, discussed above with respect to FIG. 2. In various embodiments, positioning at least one gate region within a boundary protrusion includes positioning at least one gate region within one or both of boundary protrusions 300P1 or 300P2, or within one or both of boundary protrusions 300P3 or 300P4, discussed above with respect to FIG. 3.

In some embodiments, positioning the one or more gate regions in the cell includes revising the IC layout diagram.

At operation 150, in some embodiments, one or more conductive regions are positioned in the cell. Positioning the one or more conductive regions includes positioning one or more regions in an IC layout diagram that define, at least in part, one or more IC device structural elements capable of forming an electrical connection to active areas and/or gate electrodes defined by the active and gate regions.

In various embodiments, positioning the one or more conductive regions includes positioning the one or more conductive regions along the first direction and/or along the second and third directions. In various embodiments, positioning the one or more conductive regions includes positioning one or more regions that define, at least in part, one or more of a metal diffusion segment, a source/drain contact, a metal zero segment, a metal one segment, a higher level metal segment, or a via extending from a metal diffusion segment or gate electrode to an overlying metal segment.

In various embodiments, positioning the one or more conductive regions includes positioning one or more of conductive regions MD1-MD5, M1, M2, or M01-M07B, or vias V0 or V1, as illustrated in the non-limiting examples depicted in FIGS. 5B1-5H2.

In some embodiments, positioning the one or more conductive regions includes positioning at least one of the one or more conductive regions within a protrusion of the cell boundary. In various embodiments, positioning the one or more conductive regions in the cell includes positioning at least one of the one or more conductive regions within one of protrusions 200P1, 200P2, or 200P3, discussed above with respect to FIG. 2, or within one or more of protrusions 300P1, 300P2, 300P3, or 300P4, discussed above with respect to FIG. 3.

In some embodiments, positioning the one or more conductive regions in the cell includes positioning at least one of the one or more conductive regions to be non-overlapping with a boundary recess of the cell. In various embodiments, positioning the one or more conductive regions in the cell includes positioning at least one of the one or more conductive regions to be non-overlapping with one or more of boundary recesses 200R1, 200R2, or 200R3, discussed above with respect to FIG. 2, or non-overlapping with one or more of boundary recesses 300R1, 300R2, 300R3, or 300R4, discussed below with respect to FIG. 3.

In some embodiments, positioning the one or more conductive regions in the cell includes revising the IC layout diagram.

At operation 160, in some embodiments, the layout diagram, as revised, is stored in a storage device. In various embodiments, storing the layout diagram in the storage device includes storing the layout diagram in a non-volatile, computer-readable memory or a cell library, e.g., a database, and/or includes storing the layout diagram over a network. In some embodiments, storing the layout diagram in the storage device includes storing the layout diagram over network 1314 of EDA system 1300, discussed below with respect to FIG. 13.

At operation 170, in some embodiments, at least one of one or more semiconductor masks, or at least one component in a layer of a semiconductor IC is fabricated based on the layout diagram, as revised. Fabricating one or more semiconductor masks or at least one component in a layer of a semiconductor IC is discussed below with respect to FIG. 14.

At operation 180, in some embodiments, one or more manufacturing operations are performed based on the layout diagram, as revised. In some embodiments, performing one or more manufacturing operations includes performing one or more lithographic exposures based on the layout diagram. Performing one or more manufacturing operations, e.g., one or more lithographic exposures, based on the layout diagram is discussed below with respect to FIG. 14.

By executing some or all of the operations of method 100, an IC layout diagram is generated in which a cell includes a gate region that intersects one or more active regions in the cell and is capable of intersecting one or more active regions of an adjacent cell. IC layout diagrams, and IC devices manufactured based on the IC layout diagrams, are thereby capable of avoiding dummy gate regions at cell boundaries, thereby reducing area requirements compared to approaches that do not include a gate region that intersects one or more active regions in a cell and is capable of intersecting one or more active regions of an adjacent cell.

Figure 6:
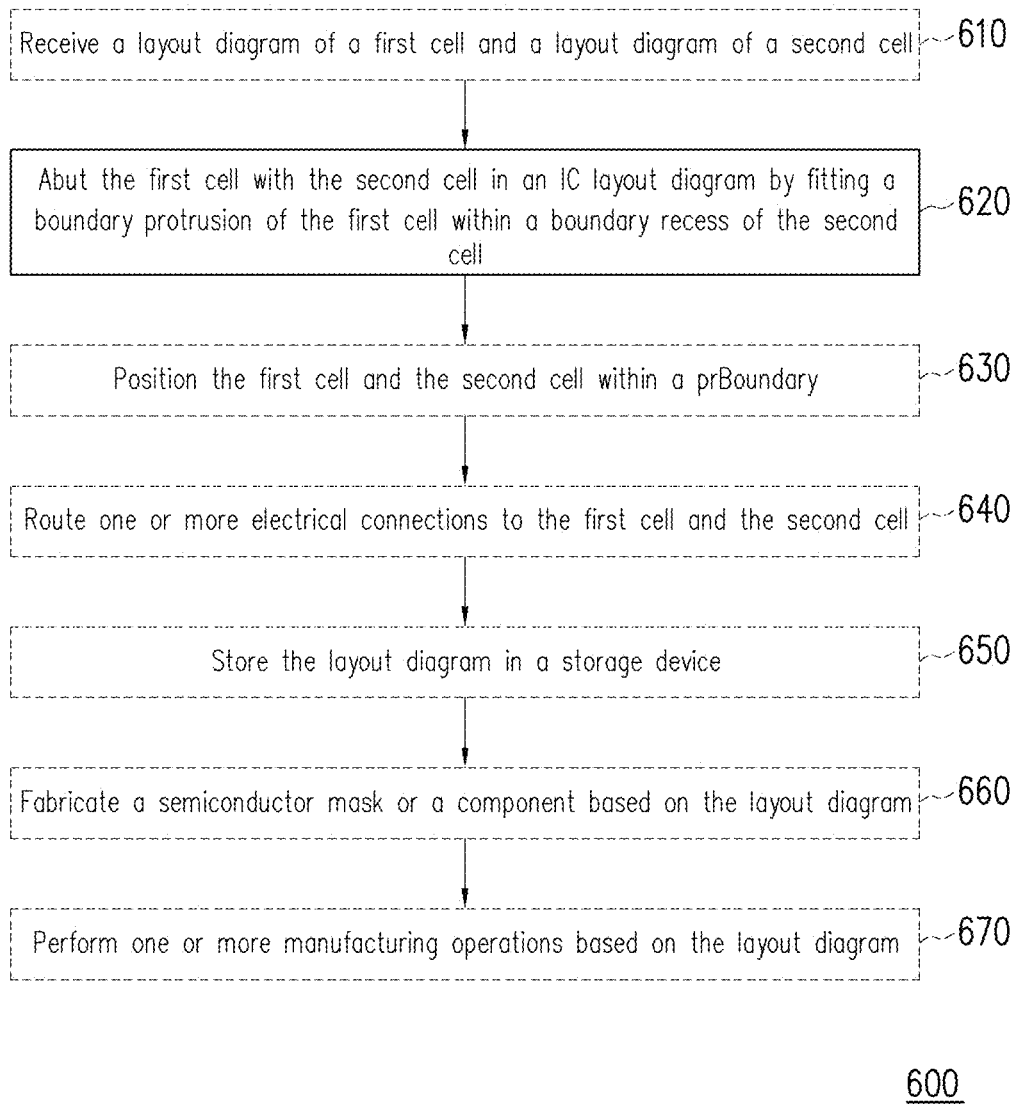
FIG. 6 is a flowchart of a method of generating a layout diagram of an IC, in accordance with some embodiments.

FIG. 6 is a flowchart of a method 600 of generating a layout diagram of an IC, in accordance with some embodiments. The operations of method 600 are capable of being performed as part of a method of forming one or more IC devices, e.g., one of IC devices 1100 or 1200 discussed below with respect to FIGS. 11 and 12, respectively, manufactured based on the generated IC layout diagram. Non-limiting examples of IC devices include memory circuits, logic devices, processing devices, signal processing circuits, and the like.

In some embodiments, some or all of the operations of method 600 are capable of being performed as part of an APR method. In some embodiments, some or all of the operations of method 600 are capable of being performed by an APR system, e.g., a system included in EDA system 1300, discussed below with respect to FIG. 13, and configured to perform the APR method.

Some or all of the operations of method 600 are capable of being performed as part of a design procedure performed in a design house, e.g., a design house 1420 discussed below with respect to FIG. 14.

In some embodiments, some or all of method 600 is executed by a processor of a computer. In some embodiments, some or all of method 600 is executed by a processor 1302 of EDA system 1300, discussed below with respect to FIG. 13.

In some embodiments, the operations of method 600 are performed in the order depicted in FIG. 6. In some embodiments, the operations of method 600 are performed in an order other than the order depicted in FIG. 6. In some embodiments, one or more operations are performed before, between, during, and/or after performing one or more operations of method 600.

FIGS. 7-10 are depictions of non-limiting examples of respective IC layout diagrams 700-1000 generated by executing one or more operations of method 600, in some embodiments. IC layout diagrams 700-1000 are simplified for the purpose of clarity. In various embodiments, one or more of IC layout diagrams 700-1000 includes features in addition to those depicted in FIGS. 7-10, e.g., one or more transistor elements, power rails, isolation structures, wells, conductive elements, or the like.

Figure 7:
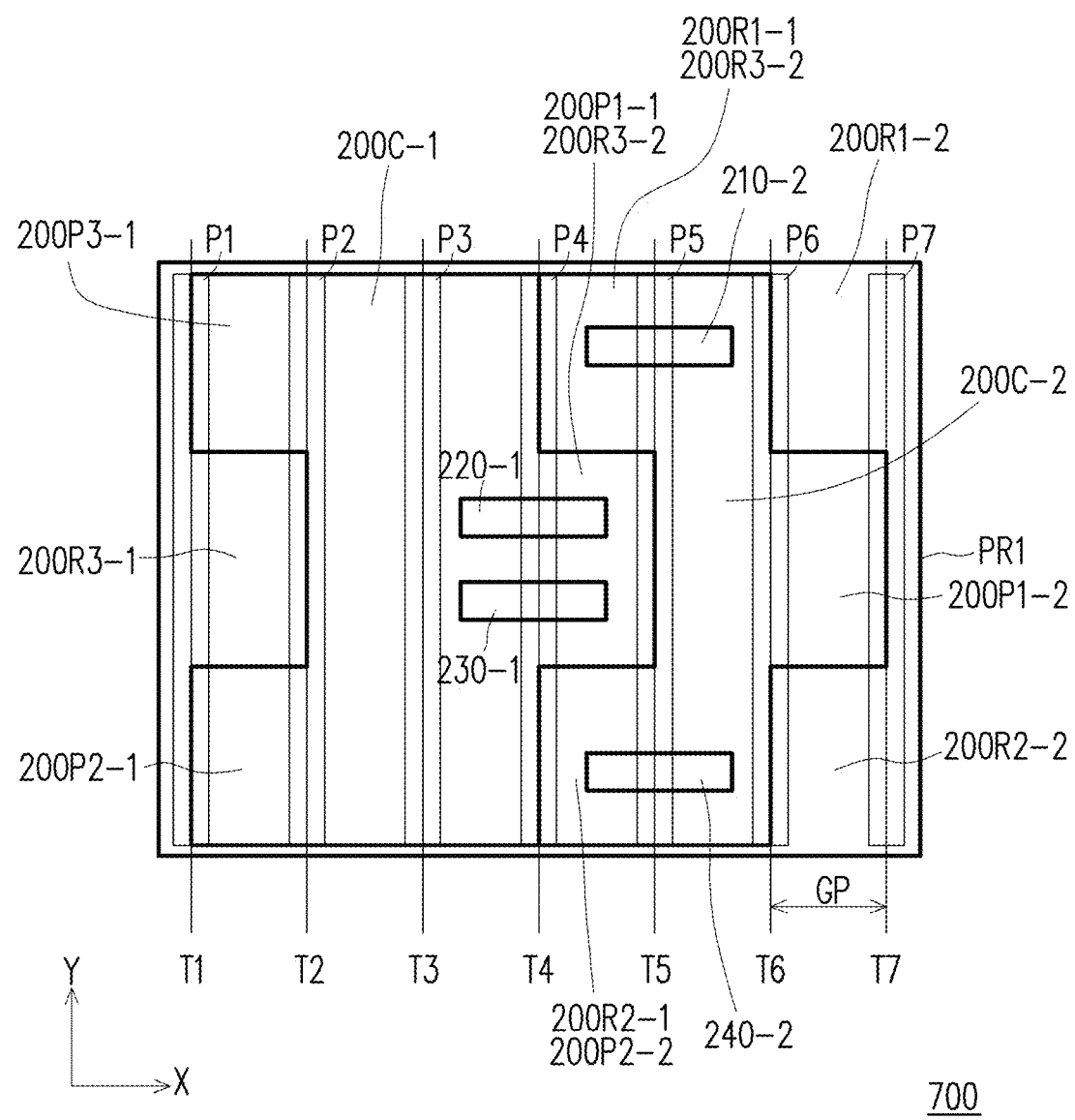
FIG. 7 is a depiction of an IC layout diagram, in accordance with some embodiments.

FIG. 7 is a depiction of IC layout diagram 700, in accordance with some embodiments. Layout diagram 700 includes cells 200C-1 and 200C-2, active regions 210-2, 220-1, 230-1, and 240-2, gate tracks T1-T7, gate pitch GP, gate regions P1-P7, a place-and-route boundary (prBoundary) PR1, and the X and Y directions. In various embodiments, IC layout diagram 700 includes one or more active regions (not shown) in addition to active regions 210-2, 220-1, 230-1, and 240-2.

Figure 8:
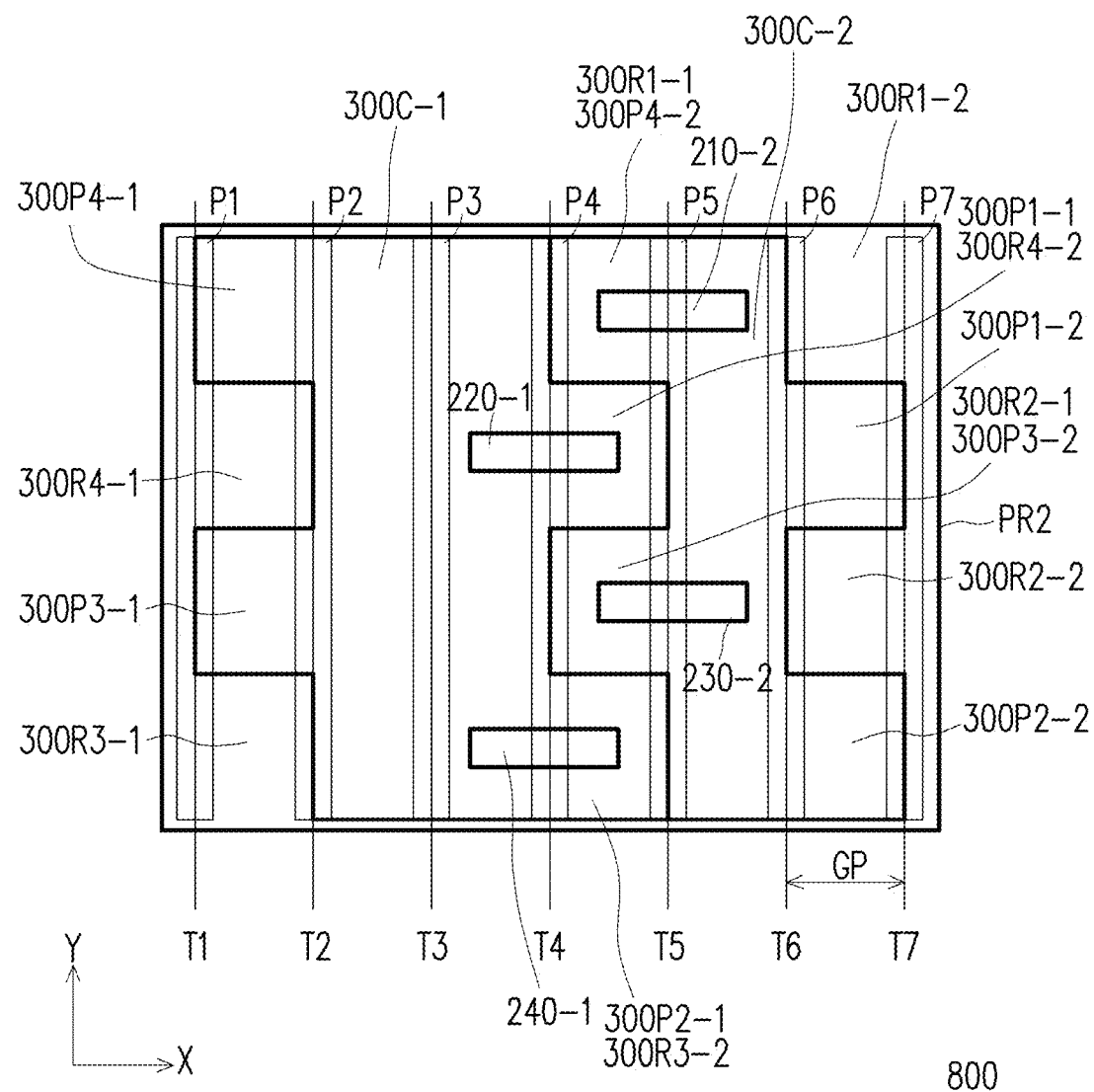
FIG. 8 is a depiction of an IC layout diagram, in accordance with some embodiments.

FIG. 8 is a depiction of IC layout diagram 800, in accordance with some embodiments. Layout diagram 800 includes cells 300C-1 and 300C-2, active regions 210-2, 220-1, 230-2, and 240-1, gate tracks T1-T7, gate pitch GP, gate regions P1-P7, a prBoundary PR2, and the X and Y directions. In various embodiments, IC layout diagram 800 includes one or more active regions (not shown) in addition to active regions 210-2, 220-1, 230-2, and 240-1.

Figure 9:
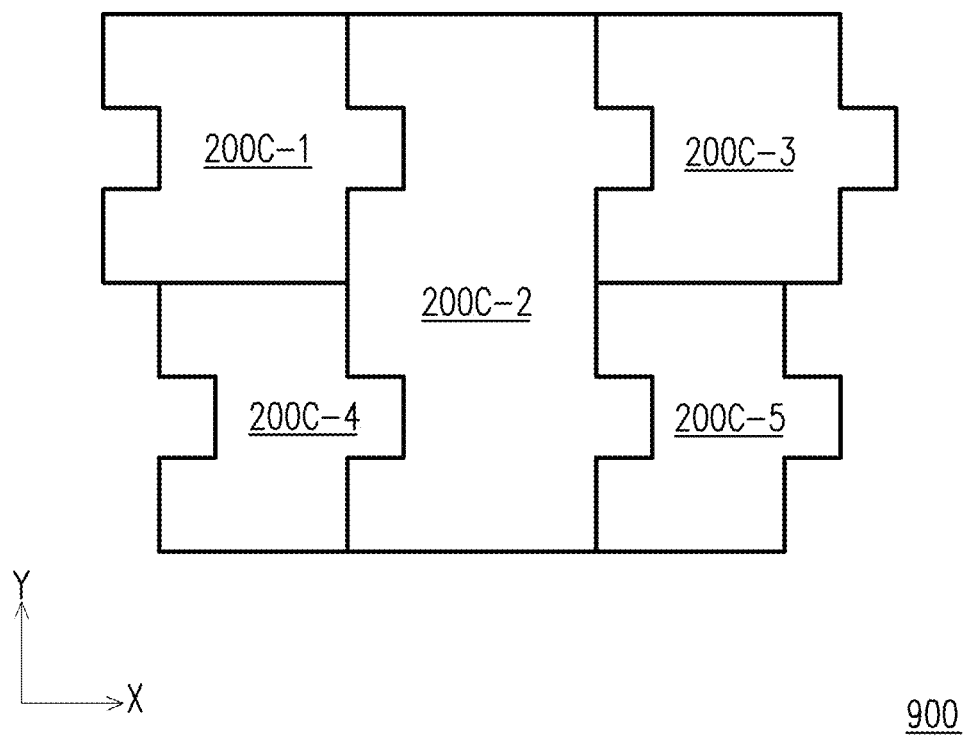
FIG. 9 is a depiction of an IC layout diagram, in accordance with some embodiments.

FIG. 9 is a depiction of IC layout diagram 900, in accordance with some embodiments. Layout diagram 900 includes cells 200C-1 through 200C-5 and the X and Y directions.

Figure 10:
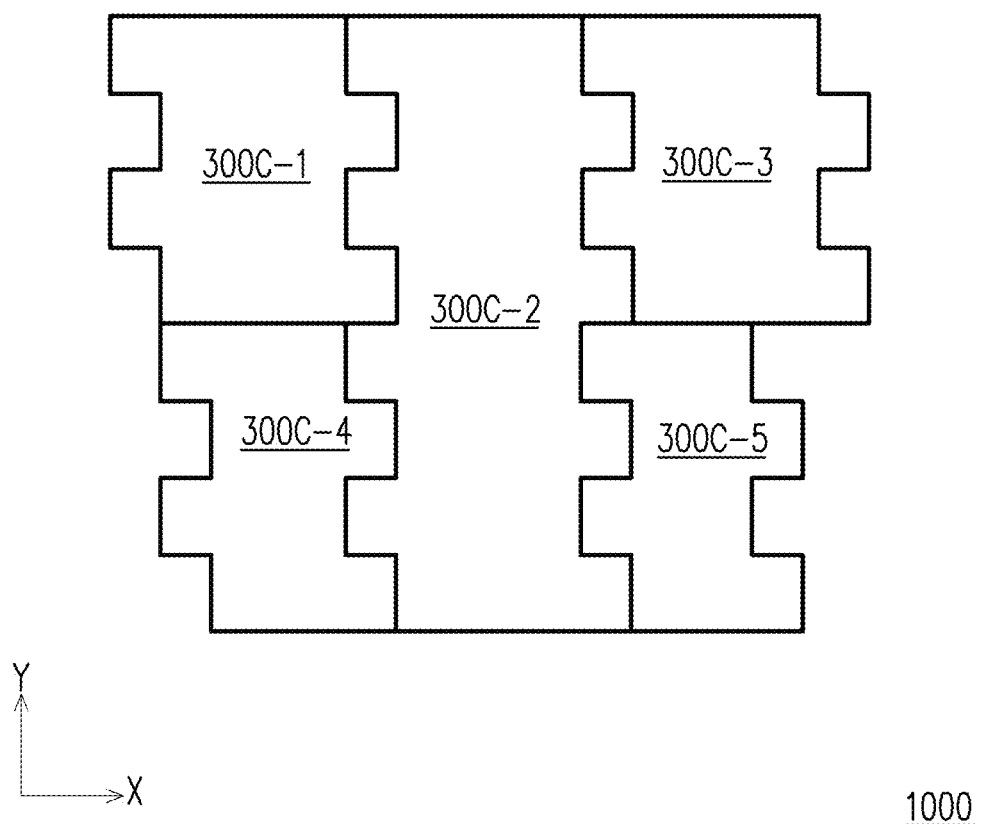
FIG. 10 is a depiction of an IC layout diagram, in accordance with some embodiments.

FIG. 10 is a depiction of IC layout diagram 1000, in accordance with some embodiments. Layout diagram 1000 includes cells 300C-1 through 300C-5 and the X and Y directions.

Each of cells 200C-1 through 200C-5 is an embodiment of cell 200C, discussed above with respect to FIG. 2, and each of cells 300C1 through 300C-5 is an embodiment of cell 300C, discussed above with respect to FIG. 3. Each of active regions 210-2, 220-1, 230-1, 230-2, 240-1, and 240-2 is an embodiment of a respective active region 210-240, discussed above with respect to FIGS. 2 and 3.

Gate tracks T1-T7 and gate pitch GP are equivalent to gate tracks T1-T6 having gate pitch GP, discussed above with respect to FIGS. 2 and 3. Gate regions P1-P7 are equivalent to gate regions P1-P6, discussed above with respect to FIGS. 5B1-5H2. The X and Y directions are discussed above with respect to FIGS. 2-4 and 5B1-5H2.

Each of prBoundaries PR1 and PR2 is a closed boundary that defines an area in which a set of electrical connections is routed to and/or from various features within the closed boundary from and/or to various features outside of the area defined by the closed boundary in one or more routing operations. In some embodiments, the one or more routing operations are part of an APR method.

In various embodiments, one or more of IC layout diagrams 700-1000 includes one or more cells (not shown) in addition to the two or more of cells 200C-1 through 200C-5 or cells 300C-1 through 300C-5 depicted in FIGS. 7-10.

In IC layout diagram 700, as depicted in FIG. 7, cell 200C-1 includes boundary recesses 200R1-1 through 200R3-1 and boundary protrusions 200P1-1 through 200P3-1, and cell 200C-2 includes boundary recesses 200R1-2 through 200R3-2 and boundary protrusions 200P1-2 through 200P3-2. The respective boundary recesses correspond to boundary recesses 200R1-200R3 and the respective boundary protrusions correspond to boundary protrusions 200P1-200P3, each discussed above with respect to FIG. 2.

Cell 200C-1 is abutted with cell 200C-2, boundary protrusion 200P1-1 thereby fitting within boundary recess 200R3-2, boundary protrusion 200P2-2 thereby fitting within boundary recess 200R2-1, and boundary protrusion 200P3-2 thereby fitting within boundary recess 200R1-1.

Each of gate regions P4 and P5 is aligned along the Y direction at a location corresponding to respective gate tracks T4 and T5, and is included in both of cells 200C-1 and 200C-2. Gate region P4 intersects boundary protrusion 200P1-1, and gate region P5 intersects boundary protrusions 200P2-2 and 200P3-2.

Gate region P4 also intersects active regions 220-1 and 230-1, and is thereby capable of being used in one or more transistors having one or more components in protrusion 200P1-1. Gate region P5 also intersects active regions 210-2 and 240-2, and is thereby capable of being used in one or more transistors having one or more components in one or both of protrusions 200P2-2 or 200P3-2.

Because each of adjacent gate regions P4 and P5 is included in both of cells 200C-1 and 200C-2 and is capable of being used in one or more transistors, IC layout diagram 700 includes cell 200C-1 abutting cell 200C-2 without a dummy gate region between cells 200C-1 and 200C-2.

In IC layout diagram 800, as depicted in FIG. 8, cell 300C-1 includes boundary recesses 300R1-1 through 300R4-1 and boundary protrusions 300P1-1 through 300P4-1, and cell 300C-2 includes boundary recesses 300R1-2 through 300R4-2 and boundary protrusions 300P1-2 through 300P4-2. The respective boundary recesses correspond to boundary recesses 300R1-300R4 and the respective boundary protrusions correspond to boundary protrusions 300P1-300P4, each discussed above with respect to FIG. 3.

Cell 300C-1 is abutted with cell 300C-2, boundary protrusion 300P1-1 thereby fitting within boundary recess 300R4-2, boundary protrusion 300P2-1 thereby fitting within boundary recess 300R3-2, boundary protrusion 300P3-2 thereby fitting within boundary recess 300R2-1, and boundary protrusion 300P4-2 thereby fitting within boundary recess 300R1-1.

Each of gate regions P4 and P5 is aligned along the Y direction at a location corresponding to respective gate tracks T4 and T5, and is included in both of cells 300C-1 and 300C-2. Gate region P4 intersects boundary protrusions 300P1-1 and 300P2-1, and gate region P5 intersects boundary protrusions 300P3-2 and 200P4-2.

Gate region P4 also intersects active regions 220-1 and 240-1, and is thereby capable of being used in one or more transistors having one or more components in one or both of protrusion 300P1-1 or 300P2-1. Gate region P5 also intersects active regions 210-2 and 230-2, and is thereby capable of being used in one or more transistors having one or more components in one or both of protrusions 300P3-2 or 300P4-2.

Because each of adjacent gate regions P4 and P5 is included in both of cells 300C-1 and 300C-2 and is capable of being used in one or more transistors, IC layout diagram 800 includes cell 300C-1 abutting cell 300C-2 without a dummy gate region between cells 300C-1 and 300C-2.

In IC layout 700, as depicted in FIG. 7, each of cells 200C-1 and 200C-2 has a same height (not labeled) in the Y direction. In IC layout diagram 900, as depicted in FIG. 9, cell 200C-2 has a height (not labeled) that differs from heights (not labeled) of each of cells 200C-1, 200C-3, 200C-4, and 200C-5, and cell 200C-2 includes greater numbers of recesses and protrusions than are included in each of cells 200C-1, 200C-3, 200C-4, and 200C-5. Cell 200C-2 is thereby capable of abutting multiple cells in one or both of the positive or negative X directions.

In the embodiment depicted in FIG. 9, cell 200C-2 abuts two cells, cells 200C-1 and cell 200C-4 in the negative X direction and two cells, cells 200C-3 and cell 200C-5 in the positive X direction. In various embodiments, cell 200C-2 abuts fewer or greater than two cells in one or both of the negative or positive X directions.

In IC layout 800, as depicted in FIG. 8, each of cells 300C-1 and 300C-2 has a same height (not labeled) in the Y direction. In IC layout diagram 1000, as depicted in FIG. 10, cell 300C-2 has a height (not labeled) that differs from heights (not labeled) of each of cells 300C-1, 300C-3, 300C-4, and 300C-5, and cell 300C-2 includes greater numbers of recesses and protrusions than are included in each of cells 300C-1, 300C-3, 300C-4, and 300C-5. Cell 300C-2 is thereby capable of abutting multiple cells in one or both of the positive or negative X directions.

In the embodiment depicted in FIG. 10, cell 300C-2 abuts two cells, cells 300C-1 and cell 300C-4 in the negative X direction and two cells, cells 300C-3 and cell 300C-5 in the positive X direction. In various embodiments, cell 300C-2 abuts fewer or greater than two cells in one or both of the negative or positive X directions.

At operation 610, in some embodiments, a layout diagram of a first cell and a layout diagram of a second cell are received. In various embodiments, receiving the layout diagrams of the first and second cells includes receiving a layout diagram of a standard cell, a custom cell, an engineering change order (ECO) cell, a logic gate cell, a memory cell, or another type of cell or combination of cells capable of being defined in an IC layout diagram. In various embodiments, a layout diagram of a logic gate cell includes a layout diagram of one or more of an AND, OR, NAND, NOR, XOR, INV, AND-OR-Invert (AOI, OR-AND-Invert (OAI), MUX, Flip-flop, BUFF, Latch, delay, or clock device. In various embodiments, a layout diagram of a memory cell includes a layout diagram of one or more of a static random access memory (SRAM), a dynamic RAM (DRAM), a resistive RAM (RRAM), a magnetoresistive RAM (MRAM), or read only memory (ROM) cell, or another device capable of having multiple states representative of logical values.

In some embodiments, receiving the layout diagrams of the first and second cells includes receiving one or more IC layout diagrams by executing some or all of the operations of method 100, discussed above with respect to FIG. 1. In various embodiments, receiving the layout diagrams of the first and second cells includes receiving one or both of cells 200C or 300C, discussed above with respect to respective FIGS. 2 and 3, and/or receiving two or more of cells 200C-1 through 200C-5, discussed above with respect to FIGS. 7 and 9, and/or receiving two or more of cells 300C-1 through 300C-5, discussed above with respect to FIGS. 8 and 10.

In various embodiments, receiving the layout diagrams of the first and second cells includes receiving one or more electronic files and/or receiving the layout diagrams of the first and second cells from a cell library. In some embodiments, receiving the layout diagrams of the first and second cells includes receiving the layout diagrams of the first and second cells over a network. In some embodiments, receiving the layout diagrams of the first and second cells includes receiving the layout diagrams of the first and second cells over network 1314 of EDA system 1300, discussed below with respect to FIG. 13.

In some embodiments, receiving the layout diagrams of the first and second cells includes receiving one or more layouts 1422 usable by an IC manufacturing system as part of an IC manufacturing flow, e.g., IC manufacturing system 1400, discussed below with respect to FIG. 14.

Receiving the layout diagrams of the first and second cells includes receiving the layout diagram of the first cell including at least one boundary protrusion and the layout of the second cell including at least one boundary recess.

In some embodiments, receiving the layout diagrams of the first and second cells includes receiving the layout diagrams of the first cell and the second cell having a same gate pitch. In some embodiments, receiving the layout diagrams of the first and second cells includes receiving the layout diagrams of the first cell and the second cell having differing gate pitches.

In some embodiments, receiving the layout diagrams of the first and second cells includes receiving the layout diagrams of the first cell and the second cell having gate pitches in which one gate pitch is a multiple of the other gate pitch. In some embodiments, receiving the layout diagrams of the first and second cells includes modifying one or more gate pitches so that the layout diagrams of the first cell and the second cell having the same gate pitch.

In some embodiments, receiving the layout diagrams of the first and second cells includes receiving at least one of the layout diagrams of the first or second cells including one or more conductive regions positioned therein. In various embodiments, the one or more conductive regions include one or more conductive regions exemplified by conductive regions MD1-MD5, M1, M2, M01-M07B, via V0, or via V1, discussed above with respect to FIGS. 5B-5H2.

In operation 620, the first cell is abutted with the second cell by fitting a boundary protrusion of the first cell within a boundary recess of the second cell, and intersecting a first gate region of the IC layout with the boundary protrusion and with a first active region of the second cell.

In some embodiments, fitting the boundary protrusion of the first cell within the boundary recess of the second cell includes the boundary protrusion of the first cell matching the boundary recess of the second cell. In some embodiments, fitting the boundary protrusion of the first cell within the boundary recess of the second cell includes leaving one or more gaps between the boundary protrusion of the first cell and the boundary recess of the second cell.

In some embodiments, fitting the boundary protrusion of the first cell within the boundary recess of the second cell includes fitting more than one boundary protrusion of the first cell within more than one boundary recess of the second cell. In some embodiments, fitting the boundary protrusion of the first cell within the boundary recess of the second cell includes fitting one or more boundary protrusions of the second cell within one or more boundary recesses of the first cell.

In various embodiments, abutting the first cell with the second cell includes abutting the first cell with one or more cells in addition to the second cell by one or more of fitting one or more boundary protrusions of the first cell within one or more boundary recesses of the second and/or additional cells or fitting one or more boundary protrusions of the second and/or additional cells within one or more boundary recesses of the first cell.

In various embodiments, abutting the first cell with the second cell includes abutting one or more of cells 200C-1 through 200C-5 or 300C-1 through 300C-5 with another one or more of cells 200C-1 through 200C-5 or 300C-1 through 300C-5, discussed above with respect to FIGS. 7-10.

In some embodiments, intersecting the first gate region with the boundary protrusion and the first active region includes forming the first gate region by merging a gate region of the first cell with a gate region of the second cell. In various embodiments, intersecting the first gate region with the boundary protrusion and the first active region includes either intersecting the first gate region of the first cell with the first active region of the second cell or intersecting the first gate region of the second cell with the boundary protrusion of the first cell.

In various embodiments, intersecting the first gate region with the boundary protrusion and the first active region includes one or both of intersecting the first gate region with one or more additional boundary protrusions of the first cell or intersecting the first gate region with one or more additional active regions of the second cell.

In various embodiments, intersecting the first gate region with the boundary protrusion and the first active region includes one or both of intersecting the first gate region with one or more boundary protrusions of one or more additional cells or intersecting the first gate region with one or more active regions of one or more additional cells.

In various embodiments, intersecting the first gate region with the boundary protrusion includes intersecting one or more of gate regions P1-P7 with one or more of boundary protrusions 200P1-1 through 200P3-2 or 300P-1 through 300P4-2, discussed above with respect to FIGS. 7 and 8. In various embodiments, intersecting the first gate region with the first active region includes intersecting one or more of gate regions P1-P7 with one or more of active regions 210-1 through 240-2, discussed above with respect to FIGS. 7 and 8.

In some embodiments, intersecting the first gate region with the boundary protrusion and the first active region includes aligning the first cell and the second cell based on a gate track. In some embodiments, aligning the first cell and the second cell based on the gate track includes aligning the first cell and the second cell based on one or more of gate tracks T1-T7, discussed above with respect to FIGS. 2, 3, 7, and 8.

In some embodiments, abutting the first cell with the second cell includes revising the IC layout diagram.

At operation 630, in some embodiments, the first cell and the second cell are positioned within a prBoundary. In some embodiments, positioning the first cell and the second cell within the prBoundary includes positioning the first cell and the second cell within one of prBoundaries PR1 or PR2, discussed above with respect to FIGS. 7 and 8, respectively.

In some embodiments, positioning the first cell and the second cell within the prBoundary includes forming one or more clear areas within the prBoundary corresponding to one or more boundary recesses of one or both of the first cell or the second cell.

In some embodiments, positioning the first cell and the second cell within the prBoundary includes revising the IC layout diagram.

At operation 640, in some embodiments, one or more electrical connections are routed to the first cell and the second cell. In some embodiments, routing the one or more electrical connections includes routing the one or more electrical connections in accordance with the prBoundary.

In some embodiments, routing the electrical connections includes routing the electrical connections as part of an APR method. In some embodiments, routing the electrical connections is performed by an APR system, e.g., a system included in EDA system 1300, discussed below with respect to FIG. 13, and configured to perform the APR method.

Routing the one or more electrical connections includes positioning one or more conductive regions within the IC layout diagram. Positioning a conductive region includes defining, at least in part, a region in a conductive layer, e.g., metal one, metal two, etc., such that a segment of the conductive layer in an IC device manufactured based on the IC layout diagram forms an electrical connection with one or more underlying elements of the IC device. In various embodiments, positioning the one or more conductive regions defines, at least in part, a segment of a conductive layer including copper or another metal suitable for forming electrical connections to the IC device.

In various embodiments, positioning the one or more conductive regions within the IC layout diagram includes positioning one or more conductive regions exemplified by conductive regions MD1-MD5, M1, M2, M01-M07B, via V0, or via V1, discussed above with respect to FIGS. 5B-5H2.

In some embodiments, routing the electrical connections to the first cell and the second cell includes revising the IC layout diagram.

At operation 650, in some embodiments, the layout diagram, as revised, is stored in a storage device. In various embodiments, storing the layout diagram in the storage device includes storing the layout diagram in a non-volatile, computer-readable memory or a cell library, e.g., a database, and/or includes storing the layout diagram over a network. In some embodiments, storing the layout diagram in the storage device includes storing the layout diagram over network 1314 of EDA system 1300, discussed below with respect to FIG. 13.

At operation 660, in some embodiments, at least one of one or more semiconductor masks, or at least one component in a layer of a semiconductor IC is fabricated based on the layout diagram, as revised. Fabricating one or more semiconductor masks or at least one component in a layer of a semiconductor IC is discussed below with respect to FIG. 14.

At operation 670, in some embodiments, one or more manufacturing operations are performed based on the layout diagram, as revised. In some embodiments, performing one or more manufacturing operations includes performing one or more lithographic exposures based on the layout diagram. Performing one or more manufacturing operations, e.g., one or more lithographic exposures, based on the layout diagram is discussed below with respect to FIG. 14.

By executing some or all of the operations of method 600, an IC layout diagram is generated in which abutted cells include a gate region that intersects a boundary protrusion of one of the abutted cells and intersects one or more active regions of the other one of the abutted cells. IC layout diagrams, and IC devices manufactured based on the IC layout diagrams, are thereby capable of avoiding dummy gate regions at cell boundaries, thereby reducing area requirements compared to approaches that do not include a gate region that intersects one or more active regions in a cell and is capable of intersecting one or more active regions of an adjacent cell.

Figure 11:
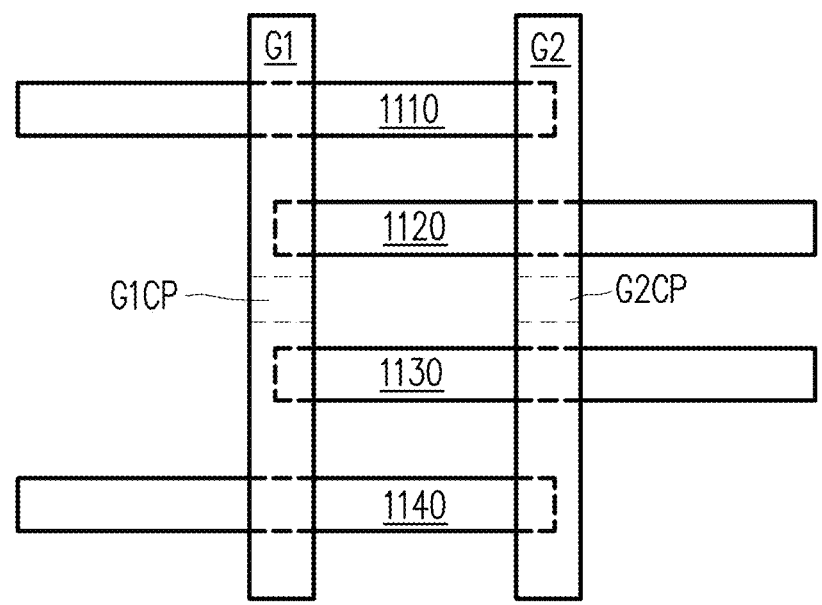
FIG. 11 is a depiction of an IC device, in accordance with some embodiments.
Figure 11:
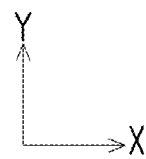

FIG. 11 is a diagram of IC device 1100, in accordance with some embodiments. IC device 1100 is formed by executing some or all of the operations of methods 100 and/or 600 and is configured in accordance with IC layout diagrams 200 and 700, discussed above with respect to FIGS. 2 and 7, respectively.

Figure 12:
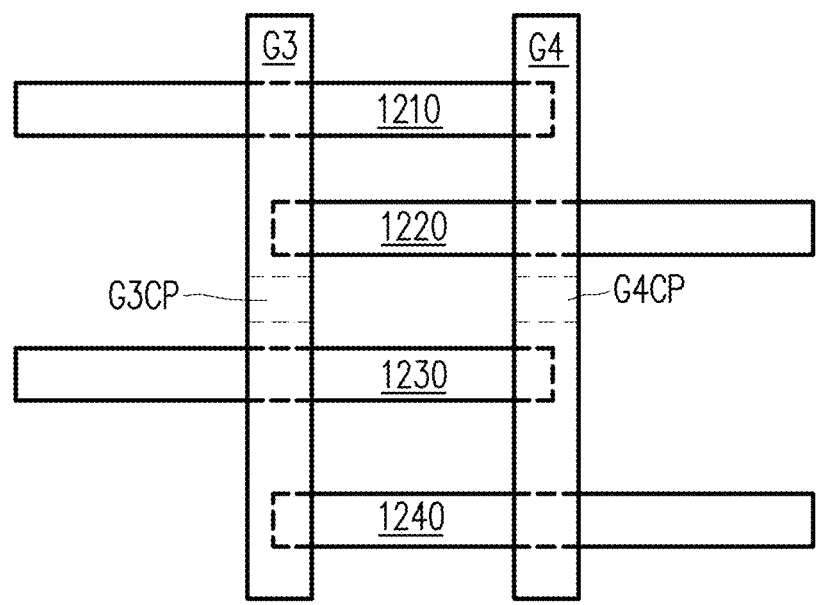
FIG. 12 is a depiction of an IC device, in accordance with some embodiments.
Figure 12:
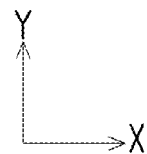

FIG. 12 is a diagram of IC device 1200, in accordance with some embodiments. IC device 1200 is formed by executing some or all of the operations of methods 100 and/or 600 and is configured in accordance with IC layout diagrams 300 and 800, discussed above with respect to FIGS. 3 and 8, respectively.

The depictions of IC device 1100 in FIG. 11 and IC device 1200 in FIG. 12 are simplified for the purpose of clarity. FIGS. 11 and 12 depict plan views of IC devices 1100 and 1200 with various features included and excluded to facilitate the discussion below. Each of FIGS. 11 and 12 further depicts the X and Y directions, discussed above with respect to FIGS. 2 and 3.

IC device 1100 includes active areas 1110, 1120, 1130, and 1140, each of which extends along the X direction, and gate structures G1 and G2, each of which extends along the Y direction and overlies each of active areas 1110, 1120, 1130, and 1140.

Active areas 1110, 1120, 1130, and 1140 are N-type or P-type active areas configured in accordance with respective active regions 210, 220, 230, and 240, and gate structures G1 and G2 are gate structures configured in accordance with various ones of tracks T1-T6, each of which is discussed above with respect to FIGS. 2 and 3.

In the embodiment depicted in FIG. 11, IC device 1100 includes four active areas and two gate structures. In various embodiments, IC device 1100 includes fewer or greater than four active areas and/or fewer or greater than two gate structures, each of which is configured in accordance with respective active and gate regions as discussed above with respect to IC layout diagram 200 and FIG. 2.

In accordance with IC layout diagram 200, gate structure G1 overlies edges of active areas 1120 and 1130, each of active areas 1110 and 1140 extends across gate structure G1, gate structure G2 overlies edges of active areas 1110 and 1140, and each of active areas 1120 and 1130 extends across gate structure G2.

In various embodiments, one or more of gate structure G1 and active area 1110, gate structure G1 and active area 1140, gate structure G2 and active area 1120, or gate structure G2 and active area 1130 is configured as an NMOS or PMOS transistor.

IC device 1200 includes active areas 1210, 1220, 1230, and 1240, each of which extends along the X direction, and gate structures G3 and G4, each of which extends along the Y direction and overlies each of active areas 1210, 1220, 1230, and 1240.

Active areas 1210, 1220, 1230, and 1240 are N-type or P-type active areas configured in accordance with respective active regions 210, 220, 230, and 240, and gate structures G3 and G4 are gate structures configured in accordance with various ones of tracks T1-T6, each of which is discussed above with respect to FIGS. 2 and 3.

In the embodiment depicted in FIG. 12, IC device 1200 includes four active areas and two gate structures. In various embodiments, IC device 1200 includes fewer or greater than four active areas and/or fewer or greater than two gate structures, each of which is configured in accordance with respective active and gate regions as discussed above with respect to IC layout diagram 300 and FIG. 3.

In accordance with IC layout diagram 300, gate structure G3 overlies edges of active areas 1220 and 1240, each of active areas 1210 and 1230 extends across gate structure G3, gate structure G4 overlies edges of active areas 1210 and 1230, and each of active areas 1220 and 1240 extends across gate structure G4.

In various embodiments, one or more of gate structure G3 and active area 1210, gate structure G3 and active area 1230, gate structure G4 and active area 1220, or gate structure G4 and active area 1240 is configured as an NMOS or PMOS transistor.

In various embodiments, one or both of IC devices 1100 or 1200 includes additional IC device elements (not shown), e.g., doped and/or epitaxial regions, wells, or isolation structures, suitable for configuring one or more combinations of active areas and gate structures as one or more NMOS or PMOS transistors.

In various embodiments, one or both of IC devices 1100 or 1200 includes one or more conductive elements (not shown), e.g., contacts, vias, or segments of a metal diffusion, metal zero, metal one, or higher metal layer, configured in accordance with conductive regions exemplified by conductive regions MD1-MD5, M1, M2, M01-M07B, via V0, or via V1, discussed above with respect to FIGS. 5B-5H2, the one or both of IC devices 1100 or 1200 thereby including one or more electrical connections to the one or more NMOS or PMOS transistors.

In various embodiments, one or more of gate structure G1 is divided into two portions by a cut portion G1CP, gate structure G2 is divided into two portions by a cut portion G2CP, gate structure G3 is divided into two portions by a cut portion G3CP, or gate structure G4 is divided into two portions by a cut portion G4CP in accordance with one or more cut poly regions exemplified by cut poly region CP discussed above with respect to FIGS. 5B1-5E2, each portion of a given gate structure thereby being separately controllable relative to each other portion of the given gate structure.

In various embodiments, in addition to active areas 1110-1140 and gate structures G1 and G2 configured in accordance with IC layout diagram 200, IC device 1100 includes one or more further combinations of active areas and gate structures (not shown) configured in accordance with IC layout diagram 200 such that IC device 1100 is configured in accordance with one of IC layout diagrams 700 or 900 discussed above with respect to respective FIG. 7 or 9.

In various embodiments, in addition to active areas 1210-1240 and gate structures G3 and G4 configured in accordance with IC layout diagram 300, IC device 1200 includes one or more further combinations of active areas and gate structures (not shown) configured in accordance with IC layout diagram 300 such that IC device 1200 is configured in accordance with one of IC layout diagrams 800 or 1000 discussed above with respect to respective FIG. 8 or 10.

By being manufactured through execution of some or all of the operations of methods 100 and 600, and being configured in accordance with IC layouts 200, 300, or 700-1000, discussed above with respect to FIGS. 1-10, each of IC devices 1100 and 1200 enables the realization of the advantages discussed above with respect to methods 100, 600, and FIGS. 1-10.

Figure 13:
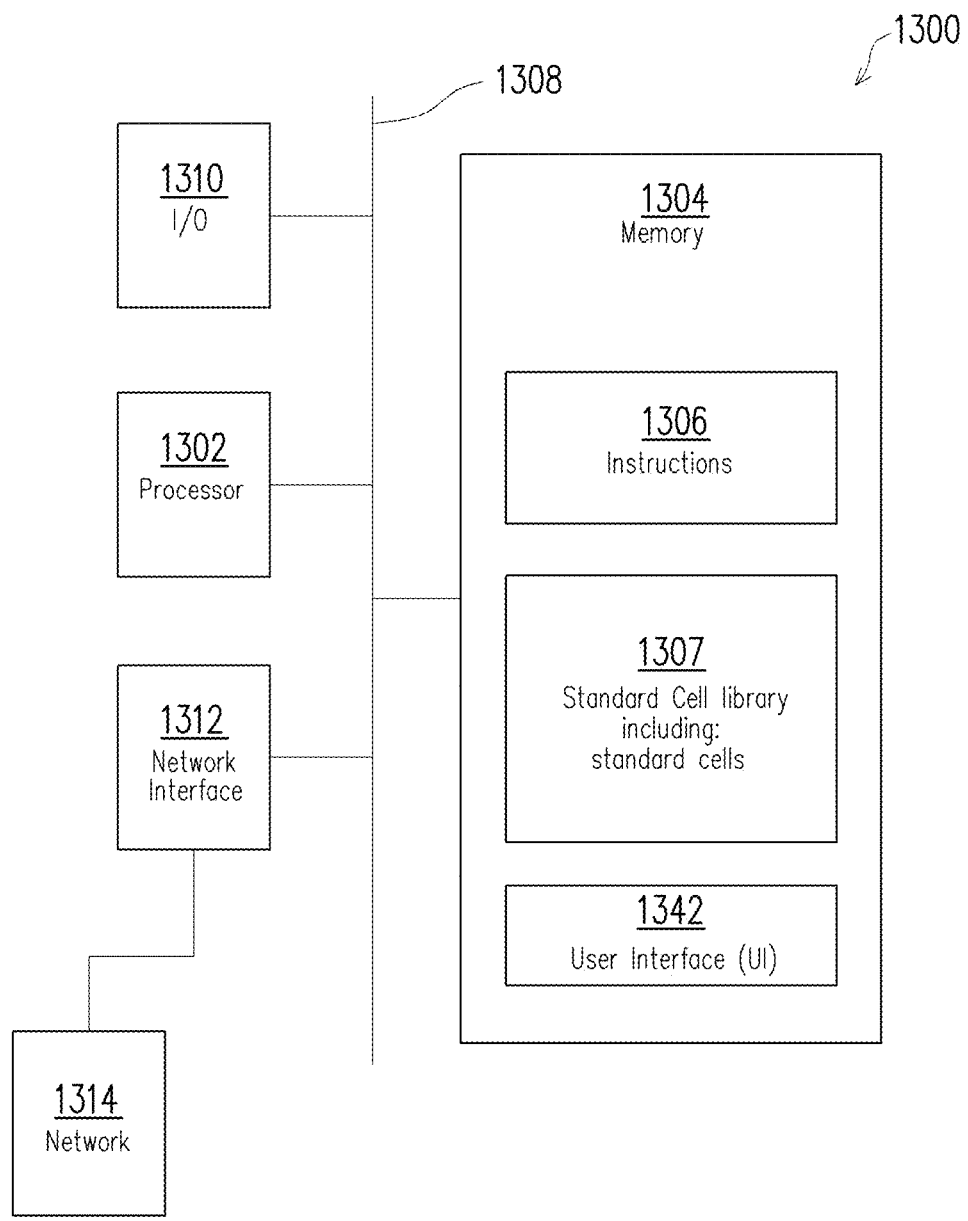
FIG. 13 is a schematic view of an electronic design automation (EDA) system, in accordance with some embodiments.

FIG. 13 is a block diagram of EDA system 1300 in accordance with some embodiments.

In some embodiments, EDA system 1300 includes an APR system. Methods described herein of designing layout diagrams and representing wire routing arrangements, in accordance with one or more embodiments, are implementable, for example, using EDA system 1300, in accordance with some embodiments.

In some embodiments, EDA system 1300 is a general purpose computing device including a hardware processor 1302 and a non-transitory, computer-readable storage medium 1304. Storage medium 1304, amongst other things, is encoded with, i.e., stores, computer program code 1306, i.e., a set of executable instructions. Execution of instructions 1306 by hardware processor 1302 represents (at least in part) an EDA tool which implements a portion or all of, e.g., the methods described herein in accordance with one or more embodiments (hereinafter, the noted processes and/or methods).

Processor 1302 is electrically coupled to computer-readable storage medium 1304 via a bus 1308. Processor 1302 is also electrically coupled to an I/O interface 1310 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. Processor 1302 is configured to execute computer program code 1306 encoded in computer-readable storage medium 1304 in order to cause EDA system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause EDA system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores a library 1307 of standard cells including such standard cells as disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows EDA system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1300.

EDA system 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a UI through I/O interface 1310. The information is stored in computer-readable medium 1304 as user interface (UI) 1342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 14:
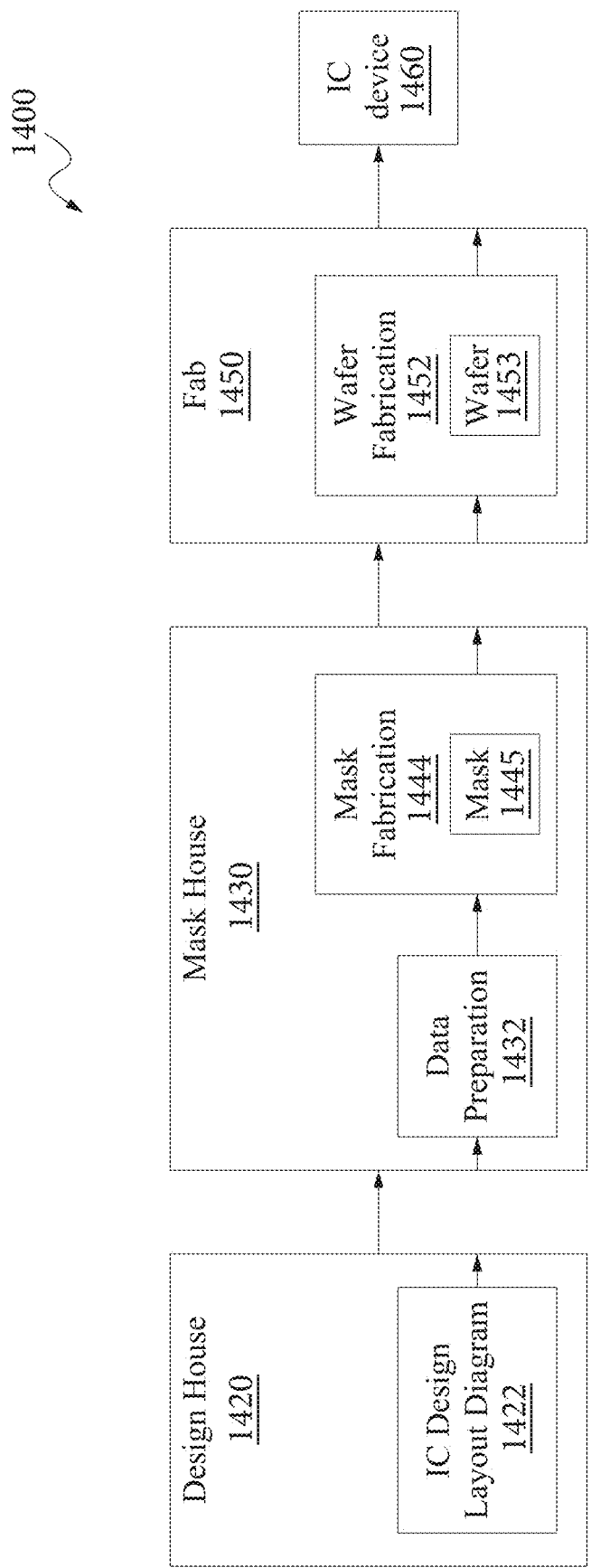
FIG. 14 is a depiction of an IC manufacturing system and an IC manufacturing flow associated therewith, in accordance with some embodiments.

FIG. 14 is a block diagram of an integrated circuit (IC) manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns designed for IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format. Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of mask data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 includes wafer fabrication 1452. IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1050 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multi-level interconnects, and the like (formed at subsequent manufacturing steps).

Details regarding an integrated circuit (IC) manufacturing system (e.g., system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of generating a layout diagram of an IC cell, the layout diagram being stored on a non-transitory computer-readable medium, includes defining a boundary recess in a boundary of the cell by extending a first portion of the boundary along a first gate track, extending a second portion of the boundary from the first gate track to a second gate track, the second portion being contiguous with the first portion, and extending a third portion of the boundary from the first gate track to the second gate track, the third portion being contiguous with the first portion, and positioning an active region in the cell by extending the active region across a third gate track, wherein the first gate track is between the second gate track and the third gate track. In some embodiments, the first gate track is separated from each of the second gate track and the third gate track by a gate pitch. In some embodiments, defining the boundary recess in the boundary of the cell includes defining a boundary protrusion in the boundary by extending a fourth portion of the boundary from a fourth gate track to a fifth gate track, the fourth portion being aligned with the second portion, extending a fifth portion of the boundary along the fifth gate track, the fifth portion being contiguous with the fourth portion, and extending a sixth portion of the boundary from the fifth gate track to the fourth gate track, the sixth portion being contiguous with the fifth portion and aligned with the third portion, wherein the fourth gate track is between the first gate track and the fifth gate track. In some embodiments, positioning the active region in the cell includes positioning the active region between the first portion and the fifth portion and between the fourth portion and the sixth portion. In some embodiments, the first gate track is separated from the second gate track by a gate pitch, and the fourth gate track is separated from the sixth gate track by the gate pitch. In some embodiments, the third gate track and the fourth gate track are a same gate track. In some embodiments, positioning the active region in the cell includes positioning a plurality of active lines corresponding to a FinFET. In some embodiments, the method includes positioning a gate region at a location corresponding to the first gate track. In some embodiments, positioning the gate region includes positioning a cut poly region configured to divide the gate region into two sections.

In some embodiments, an IC device includes a plurality of active areas, each active area of the plurality of active areas extending in a first direction, and a first gate structure extending in a second direction perpendicular to the first direction, the first gate structure overlying each active area of the plurality of active areas. A first active area of the plurality of active areas is between a second active area of the plurality of active areas and a third active area of the plurality of active areas, the first active area of the plurality of active areas extends across the first gate structure, and the first gate structure overlies an edge of each of the second active area of the plurality of active areas and the third active area of the plurality of active areas. In some embodiments, the first gate structure overlying the third active area corresponds to a gate electrode of a FinFET. In some embodiments, the IC device includes a second gate structure overlying each active area of the plurality of active areas, wherein the second gate structure and the second active area are configured as a first PMOS transistor, and the second gate structure and the third active area are configured as a first NMOS transistor. In some embodiments, a fourth active area of the plurality of active areas is between the first active area of the plurality of active areas and the third active area of the plurality of active areas, the first gate structure and the first active area are configured as a second PMOS transistor, and the first gate structure and the fourth active area are configured as a second NMOS transistor. In some embodiments, the third active area of the plurality of active areas is between the first active area of the plurality of active areas and a fourth active area of the plurality of active areas, the first gate structure and the first active area are configured as a second PMOS transistor, and the first gate structure and the fourth active area are configured as a second NMOS transistor. In some embodiments, the second gate structure is divided into two portions by a cut portion, the first PMOS transistor and the first NMOS transistor thereby being separately controllable.

In some embodiments, an EDA system includes a processor and a non-transitory, computer readable storage medium including computer program code for one or more programs. The non-transitory, computer readable storage medium and the computer program code are configured to, with the processor, cause the system to receive a layout diagram of a first cell having a first boundary including a boundary protrusion, receive a layout diagram of a second cell having a second boundary including a boundary recess, fit the boundary protrusion within the boundary recess by aligning each of the first and second cells based on a gate track, and store an IC layout diagram in a storage device, the IC layout diagram including the first cell aligned with the second cell. In some embodiments, the gate track is a first gate track, and aligning each of the first and second cells based on the gate track includes causing each of the boundary protrusion and the boundary recess to extend from the first gate track to a second gate track. In some embodiments, the first and second gate tracks are separated by a distance corresponding to a gate pitch. In some embodiments, the computer readable storage medium and the computer program code are configured to, with the processor, cause the system to route a plurality of electrical connections to the first and second cells in accordance with a place-and-route boundary surrounding the first and second cells. In some embodiments, routing the plurality of electrical connections in accordance with the place-and-route boundary includes the place-and-route boundary surrounding one or more clear areas corresponding to one or more additional boundary recesses of one or both of the first cell or the second cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating a layout diagram of an integrated circuit (IC) cell, the IC layout diagram being stored on a non-transitory computer-readable medium, the method comprising:
    defining a boundary recess in a boundary of the cell by:
        extending a first portion of the boundary along a first gate track;
        extending a second portion of the boundary from the first gate track to a second gate track, the second portion being contiguous with the first portion; and
        extending a third portion of the boundary from the first gate track to the second gate track, the third portion being contiguous with the first portion; and
    positioning an active region in the cell by extending the active region across a third gate track,
    wherein the first gate track is between the second gate track and the third gate track.

2. The method of claim 1, wherein the first gate track is separated from each of the second gate track and the third gate track by a gate pitch.

3. The method of claim 1, wherein the defining the boundary recess in the boundary of the cell comprises defining a boundary protrusion in the boundary by:
    extending a fourth portion of the boundary from a fourth gate track to a fifth gate track, the fourth portion being aligned with the second portion;
    extending a fifth portion of the boundary along the fifth gate track, the fifth portion being contiguous with the fourth portion; and
    extending a sixth portion of the boundary from the fifth gate track to the fourth gate track, the sixth portion being contiguous with the fifth portion and aligned with the third portion,
    wherein the fourth gate track is between the first gate track and the fifth gate track.

4. The method of claim 3, wherein the positioning the active region in the cell comprises positioning the active region between the first portion and the fifth portion and between the fourth portion and the sixth portion.

5. The method of claim 3, wherein
    the first gate track is separated from the second gate track by a gate pitch, and
    the fourth gate track is separated from the sixth gate track by the gate pitch.

6. The method of claim 3, wherein the third gate track and the fourth gate track are a same gate track.

7. The method of claim 1, wherein the positioning the active region in the cell comprises positioning a plurality of active lines corresponding to a fin, field-effect transistor (FinFET).

8. The method of claim 1, further comprising positioning a gate region at a location corresponding to the first gate track.

9. The method of claim 8, wherein the positioning the gate region comprises positioning a cut poly region configured to divide the gate region into two sections.

10. An integrated circuit (IC) device comprising:
    a plurality of active areas, each active area of the plurality of active areas extending in a first direction; and
    a first gate structure extending in a second direction perpendicular to the first direction, the first gate structure overlying each active area of the plurality of active areas,
    wherein
        a first active area of the plurality of active areas is between a second active area of the plurality of active areas and a third active area of the plurality of active areas,
        the first active area of the plurality of active areas extends across the first gate structure, and
        the first gate structure overlies an edge of each of the second active area of the plurality of active areas and the third active area of the plurality of active areas.

11. The IC device of claim 10, wherein the first gate structure overlying the first active area corresponds to a gate electrode of a fin, field-effect transistor (FinFET).

12. The IC device of claim 10, further comprising a second gate structure overlying each active area of the plurality of active areas, wherein
    the second gate structure and the second active area are configured as a first PMOS transistor, and
    the second gate structure and the third active area are configured as a first NMOS transistor.

13. The IC device of claim 12, wherein
a fourth active area of the plurality of active areas is between the first active area of the plurality of active areas and the third active area of the plurality of active areas,
the first gate structure and the first active area are configured as a second PMOS transistor, and
the first gate structure and the fourth active area are configured as a second NMOS transistor.

14. The IC device of claim 12, wherein
the third active area of the plurality of active areas is between the first active area of the plurality of active areas and a fourth active area of the plurality of active areas,
the first gate structure and the first active area are configured as a second PMOS transistor, and
the first gate structure and the fourth active area are configured as a second NMOS transistor.

15. The IC device of claim 12, wherein the second gate structure is divided into two portions by a cut portion, the first PMOS transistor and the first NMOS transistor thereby being separately controllable.

16. An electronic design automation (EDA) system comprising:
a processor; and
a non-transitory, computer readable storage medium including computer program code for one or more programs, the non-transitory, computer readable storage medium and the computer program code being configured to, with the processor, cause the system to:
receive a layout diagram of a first cell having a first boundary including a boundary protrusion comprising three first boundary portions;
receive a layout diagram of a second cell having a second boundary including a boundary recess comprising three second boundary portions;
fit the three first boundary portions of the boundary protrusion within the three second boundary portions of the boundary recess by aligning each of the first and second cells based on a gate track; and
store an IC layout diagram in a storage device, the IC layout diagram including the first cell aligned with the second cell.

17. The EDA system of claim 16, wherein
the gate track is a first gate track, and
the aligning each of the first and second cells based on the gate track comprises causing each of the boundary protrusion and the boundary recess to extend from the first gate track to a second gate track.

18. The EDA system of claim 17, wherein the first and second gate tracks are separated by a distance corresponding to a gate pitch.

19. The EDA system of claim 16, wherein the computer readable storage medium and the computer program code are configured to, with the processor, cause the system to route a plurality of electrical connections to the first and second cells in accordance with a place-and-route boundary surrounding the first and second cells.

20. The EDA system of claim 19, wherein the routing the plurality of electrical connections in accordance with the place-and-route boundary comprises the place-and-route boundary surrounding one or more clear areas corresponding to one or more additional boundary recesses of one or both of the first cell or the second cell.

* * * * *